US010235240B2

(12) United States Patent
Tormasov et al.

(10) Patent No.: US 10,235,240 B2
(45) Date of Patent: Mar. 19, 2019

(54) SYSTEM AND METHOD OF RELIABLE DISTRIBUTED DATA STORAGE WITH CONTROLLED REDUNDANCY

(71) Applicant: Acronis International GmbH, Schaffhausen (CH)

(72) Inventors: Alexander G. Tormasov, Moscow (RU); Stanislav Protasov, Moscow (RU); Serguei S. Beloussov, Singapore (SG)

(73) Assignee: Acronis International GmbH, Schaffhausen (CH)

( * ) Notice: Subject to any disclaimer, the term of this patent is extended or adjusted under 35 U.S.C. 154(b) by 0 days.

(21) Appl. No.: 15/201,688

(22) Filed: Jul. 5, 2016

(65) Prior Publication Data
US 2017/0004044 A1   Jan. 5, 2017

Related U.S. Application Data

(60) Provisional application No. 62/188,571, filed on Jul. 3, 2015.

(51) Int. Cl.
| | |
|---|---|
| *G11C 29/00* | (2006.01) |
| *G06F 11/10* | (2006.01) |
| *G06F 3/06* | (2006.01) |
| *H03M 13/37* | (2006.01) |
| *H03M 13/15* | (2006.01) |
| *G06F 11/20* | (2006.01) |

(52) U.S. Cl.
CPC .......... *G06F 11/1076* (2013.01); *G06F 3/064* (2013.01); *G06F 3/067* (2013.01); *G06F 3/0619* (2013.01); *G06F 3/0643* (2013.01); *H03M 13/3761* (2013.01); *G06F 11/2094* (2013.01); *H03M 13/1515* (2013.01)

(58) Field of Classification Search
CPC ...... G06F 11/1076; G06F 3/067; G06F 3/064; G06F 3/0619; G06F 3/0643; H03M 13/3761; H03M 13/1515
See application file for complete search history.

(56) References Cited

U.S. PATENT DOCUMENTS

| | | | | |
|---|---|---|---|---|
| 2012/0066441 | A1* | 3/2012 | Weingarten | G06F 11/1068 711/103 |
| 2014/0201541 | A1* | 7/2014 | Paul | G06F 21/6245 713/193 |
| 2015/0363419 | A1* | 12/2015 | Chennamsetty | G06F 17/30156 707/664 |
| 2016/0041870 | A1* | 2/2016 | Davis | G06F 11/1048 714/773 |
| 2017/0048021 | A1* | 2/2017 | Yanovsky | G06F 17/30197 |

* cited by examiner

*Primary Examiner* — Thien Nguyen
(74) *Attorney, Agent, or Firm* — Arent Fox LLP; Michael Fainberg

(57) ABSTRACT

A system and method is disclosed for data storage in a distributed data storage system. An exemplary method includes generating derivatives of a file using an (n,k) algorithm, such that k number of derivatives can be used to restore the file. Moreover, the derivatives are stored in nodes in a multilevel tree representing the distributed data storage system and a rank is calculated that indicates a fault tolerance of the file. The method further determines whether the rank is greater than or equal to k to ensure reliability of recoverability of the file. If the rank less than k, the method reorders one or more derivatives to a different node and/or store one or more additional derivative from the file.

19 Claims, 17 Drawing Sheets

| l\m | 1 | 2 | 3 | 4 | 5 | 6 |
|---|---|---|---|---|---|---|
| 6 | 2 | 0 | 0 | 0 | 0 | 0 |
| 5 | 3 | 1 | 0 | 0 | 0 | 0 |
| 4 | 7 | 3 | 1 | 0 | 0 | 0 |
| 3 | 7 | 4 | 3 | 2 | 1 | 0 |
| 2 | 9 | 6 | 4 | 3 | 2 | 1 |

Fig. 4

| l\m | 1 | 2 | 3 | 4 | 5 | 6 |
|---|---|---|---|---|---|---|
| 6 | 6 | 0 | 0 | 0 | 0 | 0 |
| 5 | 4 | 12 | 0 | 0 | 0 | 0 |
| 4 | 1.7 | 4 | 12 | 0 | 0 | 0 |
| 3 | 1.7 | 3 | 4 | 6 | 12 | 0 |
| 2 | 1.3 | 2 | 3 | 4 | 6 | 12 |

Fig. 5

| l\m | 1 | 2 | 3 | 4 | 5 | 6 |
|---|---|---|---|---|---|---|
| 6 | 3 | 0 | 0 | 0 | 0 | 0 |
| 5 | 4 | 1 | 0 | 0 | 0 | 0 |
| 4 | 8 | 4 | 1 | 0 | 0 | 0 |
| 3 | 8 | 5 | 3 | 2 | 1 | 0 |
| 2 | 10 | 7 | 5 | 3 | 2 | 1 |

Fig. 6

| l\m | 1 | 2 | 3 | 4 | 5 | 6 |
|---|---|---|---|---|---|---|
| 6 | 2 | 0 | 0 | 0 | 0 | 0 |
| 5 | 3 | 1 | 0 | 0 | 0 | 0 |
| 4 | 3 | 1 | 0 | 0 | 0 | 0 |
| 3 | 3 | 2 | 1 | 0 | 0 | 0 |
| 2 | 5 | 3 | 2 | 1 | 0 | 0 |

Fig. 7A

| l\m | 1 | 2 | 3 | 4 | 5 | 6 |
|---|---|---|---|---|---|---|
| 6 | 2 | 0 | 0 | 0 | 0 | 0 |
| 5 | 3 | 1 | 0 | 0 | 0 | 0 |
| 4 | 3 | 1 | 0 | 0 | 0 | 0 |
| 3 | 4 | 3 | 2 | 1 | 0 | 0 |
| 2 | 4 | 3 | 2 | 1 | 0 | 0 |

Fig. 7B

| l\m | 1 | 2 | 3 | 4 | 5 | 6 |
|---|---|---|---|---|---|---|
| 6 | 2 | 0 | 0 | 0 | 0 | 0 |
| 5 | 2 | 0 | 0 | 0 | 0 | 0 |
| 4 | 6 | 2 | 0 | 0 | 0 | 0 |
| 3 | 6 | 3 | 2 | 1 | 0 | 0 |
| 2 | 8 | 5 | 3 | 2 | 1 | 0 |

Fig. 7C

| l\m | 1 | 2 | 3 | 4 | 5 | 6 |
|---|---|---|---|---|---|---|
| 6 | 0 | 0 | 0 | 0 | 0 | 0 |
| 5 | 1 | 0 | 0 | 0 | 0 | 0 |
| 4 | 5 | 1 | 0 | 0 | 0 | 0 |
| 3 | 5 | 2 | 1 | 0 | 0 | 0 |
| 2 | 7 | 4 | 2 | 1 | 0 | 0 |

Fig. 7D

SYSTEM AND METHOD OF RELIABLE DISTRIBUTED DATA STORAGE WITH CONTROLLED REDUNDANCY

CROSS REFERENCE TO RELATED APPLICATIONS

The present application claims priority to U.S. Provisional Patent Application Ser. No. 62/188,571, filed Jul. 3, 2015, the entire contents of which are incorporated herein by reference.

FIELD OF TECHNOLOGY

The present disclosure generally relates to the field of electronic data backup, and, more specifically, to a system and method for reliable data storage in a distributed data-storage system with controlled redundancy.

BACKGROUND

Distributed data-storage systems ("DSSs") are complicated software solutions that operate over hardware infrastructures consisting of a large number of servers of various designations that are connected together by multiple communication channels. Existing DSSs are subject to various kinds of hardware failures, including total or partial switching off of the electrical supply, network failures that may result in the DSS being divided into separate unconnected segments, disk failures, and the like.

Conventionally, there are two main approaches to ensuring reliability of data storage in conditions of failure, based on the duplication of information and the spreading of data over different components of the distributed data-storage system. The first approach is data replication and the second approach is erasure coding.

In general, data replication is the storage of each block of data (i.e., file or object, depending on the architecture of the data-storage system) in several copies on different disks or different nodes of the system. As a result, replication makes it possible to ensure maximum efficiency of data access, including a significant increase in speed of read access to data frequently used by different clients. However, data replication can be very costly from the perspective of the amount of disk space needed to create the several copies of each block of data.

Moreover, noiseless (or lossless) coding is based on the use of mathematical algorithms that make it possible, to generate n chunks (i.e., data fragments or "derivatives") of a block of data using compression techniques in such a way that any k chunks will be sufficient to recover the initial block of data. Each of the n chunks obtained should be written to a separate disk, and, preferably, to a separate server to ensure high availability of the data. The reliability of a scheme of noiseless coding with parameters n,k (an "(n,k) scheme") is comparable to the reliability with replication of data with n−k+1 copies of each data block. Thus, the use of noiseless coding makes it possible to reduce considerably the overheads on data storage necessary for data replication—the redundancy of data storage (i.e., including the ratio of the volume of storable data to the volume of useful data) for an (n,k) scheme is equal to n/k (the size of a data chunk is approximately equal to $Size_{Block}/k$, where $Size_{Block}$ is the volume of the initial block of data). The most widely used error-correcting codes in modern software systems of data storage are Reed-Solomon codes and variations, such as Cauchy codes, for example.

Due to the size and complexity of DSSs necessary for large volumes of data, the reliability of storage and accessibility of data in these systems depends not only on the number of replicas or parameters of the noiseless-coding scheme being used, but also on the global scheme of data distribution, which determines to a considerable degree the performance of the storage system. The rapid development and introduction of cloud data technologies has resulted in the creation of large and super-large platform owners—such as Amazon S3® and EC2®, Microsoft Azure®, Google®, and the like, that have started solving these problems. Today providers can already have dozens or even hundreds of points of presence at different geographical locations to provide/support DSSs. The task of reliable and effective data storage demanded solving the problems of data redundancy distribution management on geographically distributed servers, including the challenges of optimizing storage traffic and volume, as well as failures handling. In order to come up with an economically effective solution, it is necessary not only to distribute replicas on all available servers and to control the execution of sufficiency conditions for data redundancy, but also to use them for data delivery to clients (analog of CDN—content delivery network).

As described above, simple replication of data on different servers has already proved to be inefficient. However, to ensure appropriate levels of fault tolerance for the erasure codes or the (n,k) scheme, especially in the conditions of geographically distributed storages, these methods still require semi-manual methods of management (i.e., predetermined schemes of data distribution and replication and so on).

Thus, there is a need for methods and algorithms of data distribution management using erasure codes or the (n,k) scheme.

SUMMARY

Accordingly, a system and method is disclosed herein that provides a new technique and algorithm, including a rank definition (which can be used as system requirement, agreement or SLA), that connects the methodology of data storage in a multi-level cloud storage in the "spread" or "distributed" form using erasure code/(n,k) scheme with the requirements in terms of reliability. A method for quantifying the reliability of file storage for arbitrary hierarchical topology of the distributed storage in the case of limited number of failures in the form of a computed rank are disclosed.

According to the disclosed system and method, a mechanism is provided for the collective assessment of the reliability of the storage of a single file and assessment of the importance of individual storage node as a whole in terms of fault tolerance. These assessments can then be used for further storage and maintenance of the file to ensure high recoverability in the event of a system/node failure.

According to an exemplary aspect, a method is disclosed for data storage in a distributed data storage system. The exemplary method includes generating a plurality of derivatives from a file using an (n,k) algorithm, wherein the (n,k) algorithm provides that minimum number k of the derivatives is required to restore the file; storing the derivatives in a plurality of nodes in a multilevel tree representing the distributed data storage system, wherein the multilevel tree includes at least L levels; determining a rank $r_{l,m}$ indicating a fault tolerance of the file, wherein the rank $r_{l,m}$ represents a number of derivatives available after a failure of at least one level l of the L levels with a number of failed nodes m in the level l, wherein m>0; determining whether the rank $r_{l,m} \geq k$; and if the rank $r_{l,m} < k$, reordering at least one of the plurality of derivatives to a different node of the plurality of nodes or storing at least one additional derivative from the file in one of the plurality of nodes.

According to another aspect, the method includes verifying an acceptable fault tolerance of the file if the rank $r_{l,m} \geq k$.

According to another aspect, the method includes reassembling the file from the distributed storage system using the (n,k) algorithm.

According to another aspect, at least one of $k \geq 3$ and $m \geq 2$.

According to another aspect, the method includes generating a plurality of derivatives from at least one additional file using the (n,k) algorithm; storing the derivatives from the at least one additional file in the multilevel tree, such that the rank $r_{l,m}$ of the at least one additional file is greater than or equal to k, wherein if a number of nodes on one level l of the L levels of the multilevel tree is equal to q, then for the at least one additional file, a relation of $q \geq m+1$ is satisfied, and a minimum number of the nodes on the one level l satisfies $q_{min} = m+1$.

According to another aspect, the method includes for any level l of the levels L with a rank $r_{L,m1} > 0$ and $m1 < m2$, the derivatives are stored in the plurality of nodes in the multilevel tree such that $r_{l,m2} < r_{l,m1}$.

According to another aspect, the method includes storing the derivatives in the plurality of nodes in the multilevel tree, such that none of the derivatives are duplicates.

According to another aspect, the method includes storing the derivatives in the plurality of nodes in the multilevel tree, wherein a number of unique derivatives p are stored in nodes at a lower level of the tree TF, such that $p = card(\{dj\})$, wherein $0 \leq p \leq n-1$.

According to another aspect, p equals a sum of derivatives on the lower level, and at a root of multilevel tree a total number of derivatives for the file is attributed.

According to another aspect, the method includes determining the rank $r_{l,m}$ indicating the fault tolerance of the file, such that the rank $r_{l,m}$ is equal to a sum $p_{l,m}$ of the number p of derivatives over all the elements of the level l, except for m with a biggest values of p.

According to another aspect, the method includes storing a number of k derivatives on q-m nodes for one level l of the levels L, where q-m is a number of available nodes on the level l; and storing remaining derivatives on the q-m nodes for the one level l, wherein a total number of derivatives will be $k+(round((k-1)/(q-m))+1)*m$.

According to another aspect, the method includes determining of the rank $r_{l,m}$ indicating of the file by calculating table of a file reliability matrix having a plurality of cells that each indicate a rank for each level l of the levels L and a corresponding number of node failures m of the level l.

According to another aspect, a system is disclosed for reliable data storage. In this aspect, the system includes a distributed data storage system including a plurality of nodes arranged in a multilevel tree having at least L levels; and a processor configured to generate a plurality of derivatives from a file using an (n,k) algorithm, wherein the (n,k) algorithm provides that minimum number k of the derivatives is required to restore the file, store the derivatives in the plurality of nodes, determine a rank $r_{l,m}$ indicating a fault tolerance of the file, wherein the rank $r_{l,m}$ represents a number of derivatives available after a failure of at least one level l of the L levels with a number of failed nodes m in the level l, wherein $m > 0$, determine whether the rank $r_{l,m} \geq k$, and if the rank $r_{l,m} < k$, reorder at least one of the plurality of derivatives to a different node of the plurality of nodes or store at least one additional derivative from the file in one of the plurality of nodes.

According to another aspect, the processor is further configured to verify an acceptable fault tolerance of the file if the rank $r_{l,m} \geq k$.

According to another aspect, the processor is further configured to reassemble the file from the distributed storage system using the (n,k) algorithm.

According to another aspect, at least one of $k \geq 3$ and $m \geq 2$.

According to another aspect, the processor is further configured to generate a plurality of derivatives from at least one additional file using the (n,k) algorithm; store the derivatives from the at least one additional file in the multilevel tree, such that the rank $r_{l,m}$ of the at least one additional file is greater than or equal to k, wherein if a number of nodes on one level l of the L levels of the multilevel tree is equal to q, then for the at least one additional file, a relation of $q \geq m+1$ is satisfied, and a minimum number of the nodes on the one level l satisfies $q_{min} = m+1$.

According to another aspect, the processor is further configured to store a number of k derivatives on q-m nodes for one level l of the levels L, where q-m is a number of available nodes on the level l; and store remaining derivatives on the q-m nodes for the one level l, wherein a total number of derivatives will be $k+(round((k-1)/(q-m))+1)*m$.

According to another aspect, the processor is further configured to determine the rank $r_{l,m}$ indicating of the file by calculating table of a file reliability matrix having a plurality of cells that each indicate a rank for each level l of the levels L and a corresponding number of node failures m of the level l.

According to another aspect, the plurality of nodes of the distributed data storage system are geographically distributed data storage modules configured to store one or more derivatives of the file.

According to another aspect, if a top level of the multilevel tree of the distributed data storage system fails, then all nodes on lower levels of the multilevel tree become unavailable.

According to another aspect, a non-transitory computer readable medium storing computer executable instructions is provided for storing data in a distributed data storage system. In this aspect, there are instructions included for generating a plurality of derivatives from a file using an (n,k) algorithm, wherein the (n,k) algorithm provides that minimum number k of the derivatives is required to restore the file; storing the derivatives in a plurality of nodes in a multilevel tree representing the distributed data storage system, wherein the multilevel tree includes at least L levels; determining a rank $r_{l,m}$ indicating a fault tolerance of the file, wherein the rank $r_{l,m}$ represents a number of derivatives available after a failure on at least one level l of the L levels with a number of failed nodes m in the level l, wherein $m > 0$; determining whether the rank $r_{l,m} \geq k$; and if the rank $r_{l,m} < k$, reordering at least one of the plurality of derivatives to a different node of the plurality of nodes or storing at least one additional derivative from the file in one of the plurality of nodes.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplary pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

FIG. 4 illustrates an exemplary table of a file reliability matrix for the storage tree according to an exemplary aspect.

FIG. 5 illustrates an exemplary table of a file storage redundancy matrix according to an exemplary aspect.

FIG. 6 illustrates an exemplary table of a file reliability matrix for the storage tree with an addition derivative stored therein according to an exemplary aspect.

FIGS. 7A-7D illustrates exemplary file reliability matrices according to exemplary aspects.

DETAILED DESCRIPTION

Figure 1A:
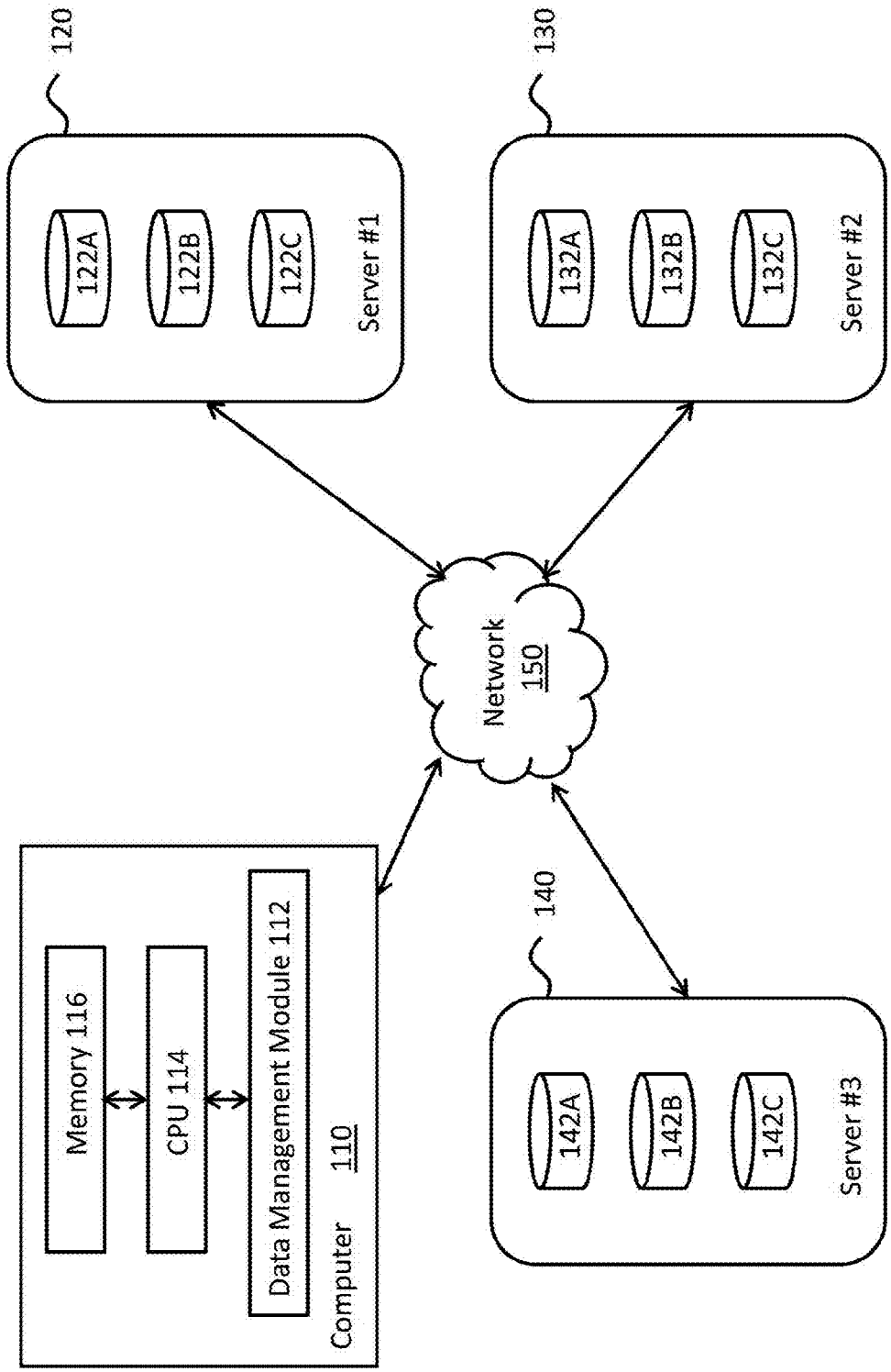
FIG. 1A is a block diagram illustrating the distributed data storage system in a distributed data storage environment according to an exemplary aspect.

Various aspects of the invention are now described with reference to the drawings, wherein like reference numerals are used to refer to like elements throughout. In the following description, for purposes of explanation, numerous specific details are set forth in order to promote a thorough understanding of one or more aspects of the invention. It may be evident in some or all instances, however, that any aspects described below can be practiced without adopting the specific design details described below. In other instances, well-known structures and devices are shown in block diagram form in order to facilitate description of one or more aspects. The following presents a simplified summary of one or more aspects of the invention in order to provide a basic understanding thereof.

According to the system and method described herein, a quantitative service level agreement ("SLA") is disclosed that provides fault tolerance proof and geographical data distribution as a result of a whole geographical location fault tolerance proof. It is important to be able to formulate the corresponding agreement (i.e., data storage system configuration) taking into account both the general fail tolerance level (up to geographically distributed ones) and a quantitative assessment of information storage quality. Thus, the system and method disclosed herein evaluates the reliability in relation to the possible disappearance (temporary or permanent failure) of any branch in the hierarchy (spatially-correlated problems). The concepts of fault tolerance rank as a parameter in relation to simultaneous inaccessibility of a predetermined number of certain level nodes is introduced, and the ways of its use and maintenance are provided to ensure reliable data storage and maintenance.

FIG. 1A is a block diagram illustrating the distributed data storage system in a distributed data storage environment according to an exemplary aspect. As shown, the distributed data storage system includes a computer 110, a plurality of storage nodes (i.e., the servers and/or associated disks) 120, 130, 140, and a network 150. The storage nodes are in communication with a computer 110 through the network 150. As explained in detail below, the computer 110 is configured to control the distributed data storage methods according to the algorithms disclosed herein. In particular, based on these algorithms, the computer 110 can store one or more blocks of data in the system by distributing chunks (i.e., "derivatives") of the data across the disks of the storage nodes, i.e., servers 120, 130 and 140. Moreover, the computer 110 is configured to determine the fault tolerance of the file once it is distributed in the various nodes and, if necessary, perform one or more actions to improve fault tolerance or the like. It should be appreciated that the derivatives are fragments of the original block of data.

As generally shown, each of the servers 120, 130 and 140 comprises a plurality of nodes and/or disks for data storage. For example, server 120 includes disks 122A, 122B and 122C, server 130 includes disks 132A, 132B and 132C and server 140 includes disks 142A, 142B and 143C. It should be appreciated that three servers and three disks per server is shown according to illustrated aspect, but that the exemplary aspect is in no way intended to be limited to this number of servers and/or disks. Moreover, while FIG. 1A illustrates that the servers 120, 130 and 140 communicate remotely with computer 110 via network 150, it should be appreciated that the data storage system disclosed herein for storing derivatives of the File F can be one or more local hard disks (i.e., local to the computer 110) that are provided as separated physical or logical storage elements as would be understood to one skilled in the art.

Furthermore, it is contemplated that each of the servers 120, 130 and 140 can generally include hardware and software components configured to manage various storage resources within the computing environment. According to the exemplary aspect, each of the disks can be a typical data storage device (e.g., hard disk drives, optical drives, magnetic tape drives and/or the like). In conjunction with the computer 110 and the network 150, the servers 120, 130 and 140 collectively form the data distributed system that is provided to facilitate temporary and/or permanent storage of computer data. The computer data may be any type of electronic, digital data generated and/or stored by a computer. For example, the computer data can represent text data, executable program code, or any other type of digital data. It is further contemplated according to one aspect that the servers can be provided as forming an online/remote file storage service (e.g., a cloud computing service) in one aspect, but alternatively can be incorporated into a local area network or the like as should be appreciated to those skilled in the art.

As further noted above, the computer 110 is capable of communicating with the servers via network 150. According to the exemplary aspect, the computer 110 may be any type of computing device and preferably a separate server configured to manage the distributed data-storage system, but alternatively can be a laptop, a desktop, and the like. The specific details of the exemplary computer 110 will be described below with respect to FIG. 10. However, as generally shown in FIG. 1, the computer 110 includes data management module 112, computer-processing unit ("CPU") 114 and memory 116. Moreover, it should be appreciated that while the exemplary aspect is described as being implemented on single computer 110, the system and method can also be implemented on multiple computers according to an alternative aspect. Thus, for the purpose of high availability, the system can include several computers with such services deployed and services have some consensus protocol to communicate and agree on each other action.

According to one aspect, the data management module 112 includes software code (e.g., processor executable instructions) in memory, which may be configured to execute/facilitate the algorithms described here for distributed data storage and management. As shown, the computer 110 includes CPU 114 for executing the data management module 112 and memory 116 according to an exemplary aspect.

Furthermore, network 150 can be any network for communicating data and data operations and can include a communication system (not shown) that connects the various computers of the system by wire, cable, fiber optic, and/or wireless links facilitated by various types of well-known network elements, such as hubs, switches, routers, and the like. Network 150 may employ various well-known protocols to communicate information amongst the network resources. In one aspect, the network 150 can be part of the Internet or intranet using various communications infrastructure such as Ethernet, WiFi and the like.

For purposes of this disclosure, the computer 110 is configured to store data in the distributed storage system, and, in particular, across one or more of the nodes/disks shown in FIG. 1A. According to an exemplary aspect, the computer 110 is configured to store a file F having a size S (i.e., an object of storage) (possibly up to precise rounding off) as the consecutive order of binary storage units (e.g., bits, bytes, sectors, clusters, etc.). Moreover, it is assumed that the storage system will include servers with a set of L nodes, as shown in FIG. 1A, for example. According to an exemplary aspect, L may be a variable number, but the disclosure assumes L is a fixed number in order to describe the static state of the system.

Applying the (n,k) scheme for distributed storage of file F, the system must store k chunks (also referred to as "derivatives") that will be sufficient to recover the initial file F. Each of the n chunks obtained should be written to a separate disk, and, preferably, to a separate server to ensure high availability of the data, although two or more derivatives can be stored to the same node as will be described below. According to the exemplary embodiment, the system (the term "system" refers to computer 110, for example) can employ an algorithm B that can create n "derivatives" of file $\{d_i\}$, where i=0 ... n−1, D(F)={di}. Moreover, since any k derivatives are sufficient to restore F, the computer 110 can implement an algorithm R that takes a set of different derivatives {dj} as an input, where j ∈ $\{k_m\}$ is a subset of natural numbers, such that $0 \leq k_j \leq n-1$ and cardinal of set is equal k:

card($\{k_m\}$)=k, and R({dj})=F.

Moreover, according to an exemplary aspect, the size of each of the derivatives $d_i$ is identical and equal to S/k: size (di)=S/k (rounding to the nearest binary storage units). Although the derivatives $d_i$ could have varying sizes according to alternative aspects. In the exemplary aspect, each of derivatives $d_i$ is stored entirely on one of the nodes, wherein each node can contain from 0 to n−1 derivatives. Thus, to restore a file F, the system (e.g., computer 110) can access every k derivative from any nodes and apply them to an algorithm R to reassemble the file F.

Moreover, according to one aspect, the system can split big files to a set of clusters (e.g., 4 kb) and implement storage model for real file clusters, not to the origin file itself. This approach is implementation-dependent. It should be appreciated that according to the exemplary aspect, an obvious consequence of the chosen method is the lack of duplication of derivatives. Thus, in case two equal copies of the same derivative have been received during the restoration of the information, the algorithm R cannot be executed as should be appreciated.

As described above, FIG. 1A generally illustrates a distributed storage system having a plurality of servers 120, 130 and 140 with each server including a plurality of nodes and/or disks for data storage. It is often the case that existing distributed storage system will be implemented according to a multilevel tree configuration. For example, the three servers shown in FIG. 1A could be associated with a particular territory and each disk can be a leaf on the tree design.

Figure 1B:
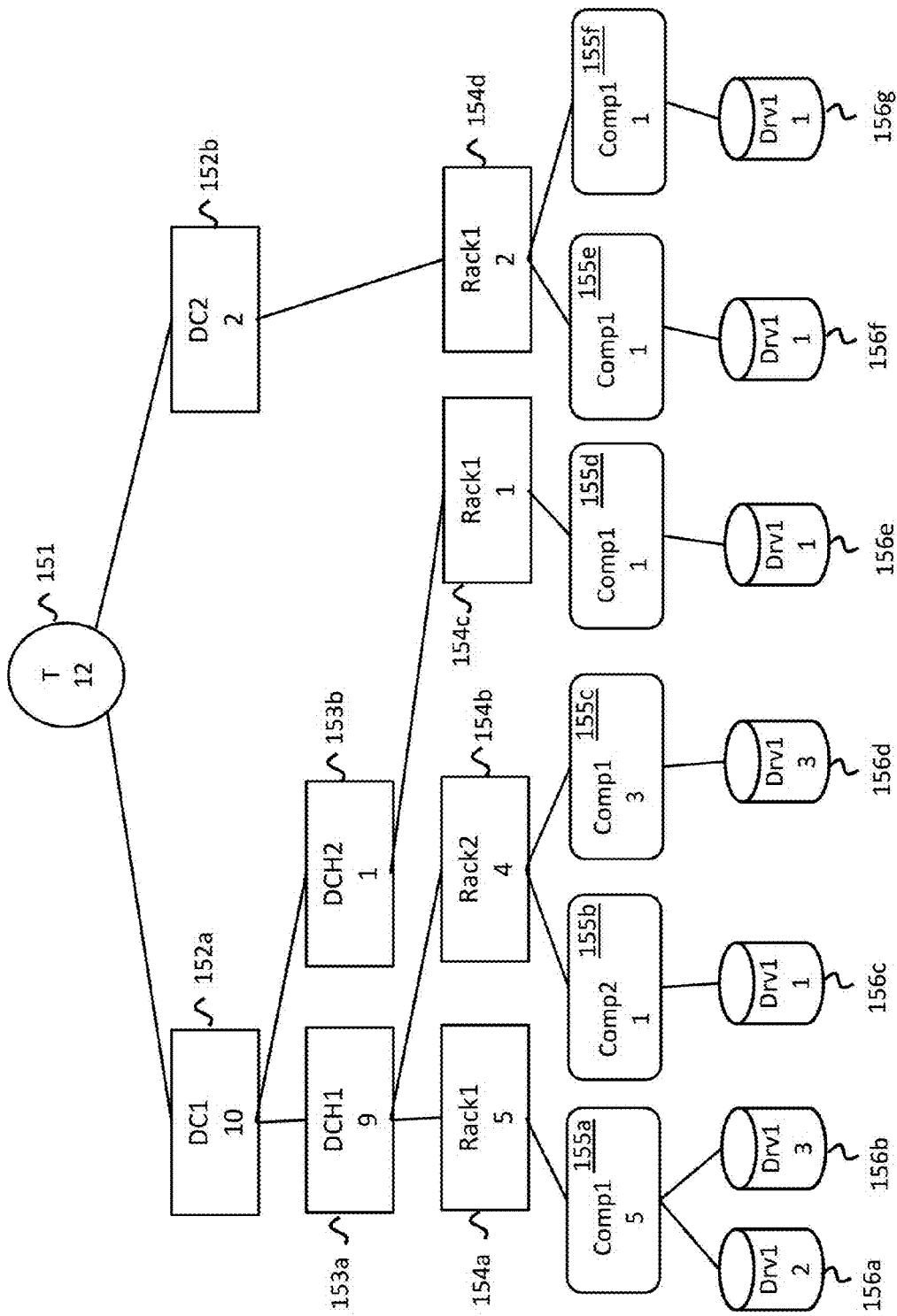
FIG. 1B illustrates a block diagram of a multilevel tree configuration for a distributed data storage according to an exemplary aspect.

FIG. 1B illustrates a block diagram of a multilevel tree configuration for distributed data storage according to an exemplary aspect. For example, the block diagram illustrates a multilevel tree $T_F$, where its root is one dummy point of the description, and each of its levels is an organizational unit of storage, and the leaves are the storages, which can accommodate at least one derivative of the file $d_i$. As shown, the T tree can have the following hierarchy levels for geographically distributed storage of the "Internet scale" (or the country):

"Plate/disc segment" (not used yet)—DrvSeg

"Disk"—Drv (156a-156g)

"Computer"—Comp (155a-155f)

"Desk with computers"—i.e., Rack (154a-154d)

"Data center hall"—DCH (153a & 153b)

"Data Center"—DC (152a & 152b); and

"Territory"—T (151).

For purposes of this disclosure, level of the tree $T_F$ are referred to as level l, for example. According to the exemplary aspect, the disks 156a-156g are on "level 2", the computers 155a-155f are on "level 3", the racks 154a-154d are on "level 4", the data center halls 153a and 153b are on "level 5", and the data centers 152a and 152b are on "level 6".

Although not shown, additional levels of the tree can even include "Country"—Coun and "Continent"—Cont. According to the exemplary aspect, the lowest levels (Drv, i.e., 156a-156g) can each store one or more unique derivatives {dj}, where, as shown, each Drv includes a "weight" p, which will be discussed in detail below. Thus, according to the exemplary aspect, all of the derivatives of the file F can be stored at the lowest level of the tree $T_F$, with:

p=card({dj}), such that p satisfies the following at any time: $0 \leq p \leq n-1$ As shown, the exemplary system only evaluates the tree leaves that contain p>0 (at least something related to file). Moreover, it is assumed that every tree node/leaf has a unique identifier.

According to the exemplary aspect, to the middle levels (up to the higher levels), the p number equal to the sum of all p on the lower levels. Thus, the total number of "derivatives" for the specific file F, available in storage at any time, is attributed to the root of tree $T_F$. According to the example of FIG. 1B, the territory "T" 151 has a p number equal to 12. This means that there are 12 derivatives within the territory "T" 151. This can be seen in that disks "Drv" 156a through 156g have a total of 12 unique derivatives stored thereon. In particular, there are 2 derivatives on disk 156a, 3 derivatives on disks 156b and 156d, and 1 derivative on each of disks 156c and 156e through 156g.

As noted above, using the (n,k) scheme for distributed storage of file F, the system must store k derivatives to ensure file recovery of the file F in the event of a disaster, system failure, etc. Using the tree $T_F$ illustrated in FIG. 1B as an example, it is assumed that a "failure" is a complete malfunction of the subtree branch from the point when the failure happened and going "downwards". Thus, the failure leads to the complete unavailability (temporary or permanent) of a number of derivatives of the file F needed to reconstruct the using the recovery algorithm R. For example, if data center 152b fails, then it is assumed that rack 154d, computers 155e and 155f and disks 156f and 156g are unavailable. As a result, the derivatives stored on disks 156f and 156g would also be unavailable.

According to an exemplary aspect, the system and method disclosed herein is configured to calculate a fault tolerance rank of $r_{l,m}$ of the file F stored within the (n,k) scheme in the tree $T_F$. Specifically, the rank $r_{l,m}$ with 1≤l≤max_level and m>0 is the minimal number of derivatives available after the failure of any organizational unit level l with the number of failed nodes m (where max_level is the maximum available number of levels in tree $T_F$, and m is a number of simultaneously independently failed nodes of this level). In other words, all p derivatives that are stored inside the devices lower in the hierarchy of the failure point, with the number of nodes m, have become unavailable and should be subtracted from the total number of available nodes in the system.

Applying this ranking to the tree $T_F$ shown in FIG. 1B, the ranking $r_{6,1}$ would indicate a rank with the complete failure point of Level 6—Data Center 152a or 152b, i.e., the complete failure of one data center. In another example, the rank $r_{2,5}$ is the rank in the case of complete simultaneous failure of 5 randomly chosen disks in the system (located anywhere either in the same computer or in computers installed in different desks or data centers on different continents). In other words, the disks 156a-156g are in level 2 and the rank is for the case when any 5 of these disks (i.e., nodes) fail. According to an exemplary aspect, the actual value of the rank is the amount of available derivatives' of the file F for the recovering of the algorithm R. It should be appreciated that the larger rank with other fixed parameters indicates more reliability for the file storage of file F.

Figure 1C:
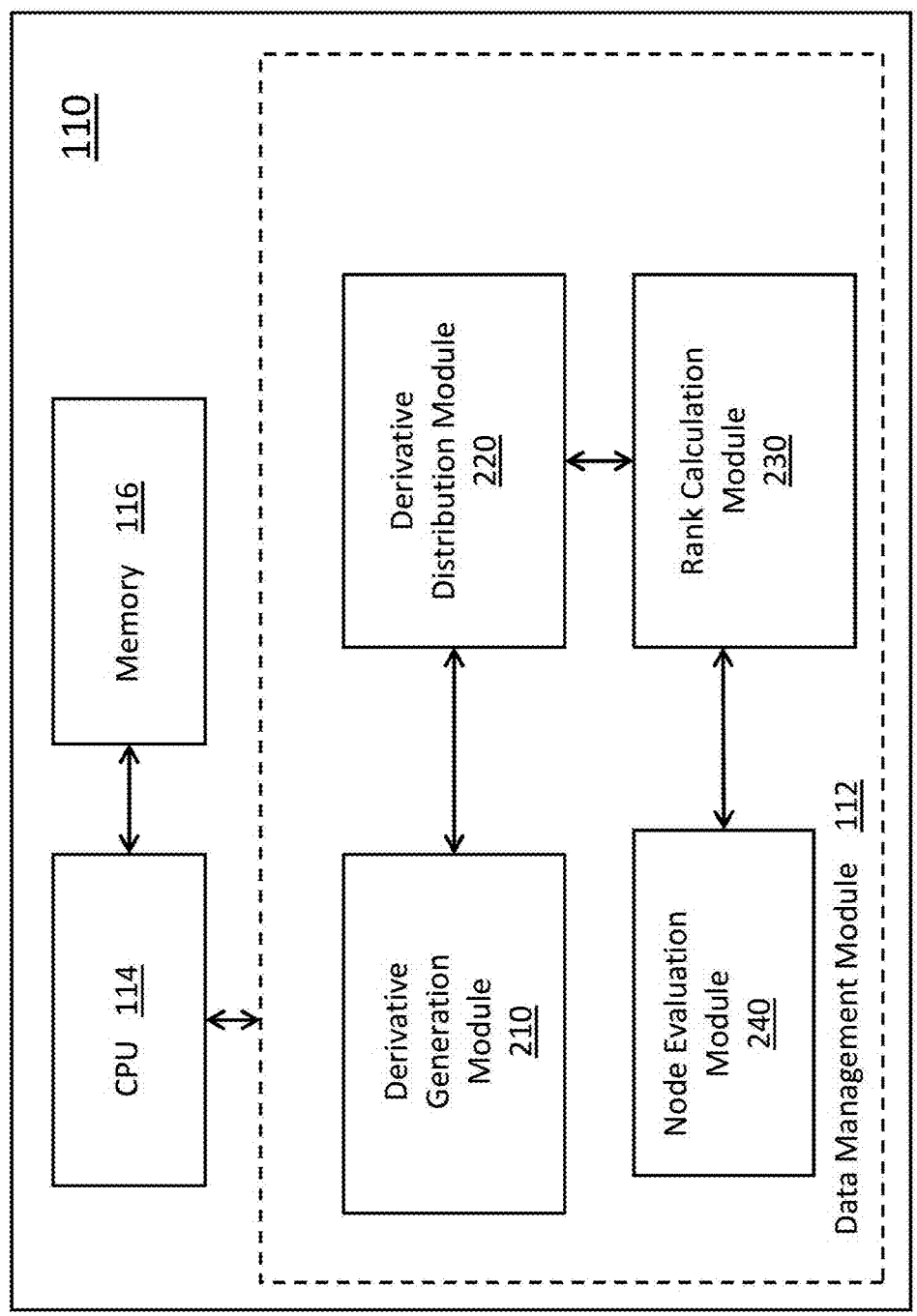
FIG. 1C illustrates a block diagram of a computer for data storage in the distributed data-storage system according to an exemplary aspect.

FIG. 1C illustrates a block diagram of a computer for data storage in the distributed data-storage system according to an exemplary aspect. In particular, the client computer shown in FIG. 1C illustrates a more detailed view of the computer 110 of system 100 described above with respect to FIG. 1A.

As described above, the computer includes a CPU 114 and memory 116. Furthermore, the computer 110 includes a data management module 112 that is configured to perform the algorithms described below for reliable data storage and management of a file F according to the exemplary aspects. As shown in FIG. 1C, the data management module 112 can be composed of a plurality of modules. As used herein, the term "module" refers to a software service or application executed on one or more computers, including real-world devices, components, or arrangement of components implemented using hardware, such as by an application specific integrated circuit (ASIC) or field-programmable gate array (FPGA), for example, or as a combination of hardware and software, such as by a microprocessor system and a set of instructions to implement the module's functionality, which (while being executed) transforms the microprocessor system into a special-purpose device. A module can also be implemented as a combination of the two, with certain functions facilitated by hardware alone, and other functions facilitated by a combination of hardware and software. In certain implementations, at least a portion, and in some cases, all, of a module can be executed on the processor of a general purpose computer. Accordingly, each module can be realized in a variety of suitable configurations, and should not be limited to any example implementation exemplified herein.

In particular, the data management module 112 can include a derivative generation module 210, a derivative distribution module 220, a rank calculation module 230 and a node evaluation module 240. For purposes of the disclosure below with respect to the exemplary algorithms, the disclosure generally refers to the computer 110 and/or the data management module 112 as performing the various steps, but it should be appreciated that the applicable modules shown in FIG. 1C are provided to perform such steps according to an exemplary aspect. For example, the derivative generation module 210 is provided to receive one or more files F, designated for data storage, and create N chunks or derivatives of the file for distribution on the multi-level (i.e. hierarchical) tree, as shown in FIG. 1B. Moreover, derivative distribution module 220 is configured to selected the different nodes in the distributed data storage system for storage of the derivatives of file F. These nodes, for example, can be the disks 156a-156g described above with respect to FIG. 1B. The rank calculation module 230 is also configured to evaluate the distribution of the derivatives in the distributed data storage system (i.e., the multi-level tree) by calculating a rank $r_{l,m}$ of the file F, to evaluate the fault tolerance and recoverability of the file F if one or more nodes in the distributed data storage system experiences a failure condition. Moreover, the derivative distribution module 220, using the rank $r_{l,m}$ of the file F, can select locations for additional derivatives to restore failed derivatives or to achieve different rank. Moreover, the derivative distribution module 220 is configured to select nodes in the system to reorder current set of derivatives to achieve load balance, reliability, access pattern, and the like as will be described herein. Finally, a node evaluation module 240 is provided to determine the value of a particular node, and the like, as will also be described in detail below.

Figure 2:
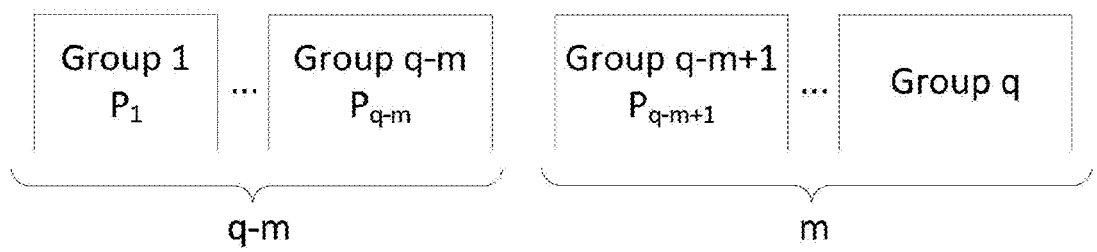
FIG. 2 illustrates a flowchart for distributing of derivatives on nodes of a distributed storage system tree according to an exemplary aspect.
Figure 2:
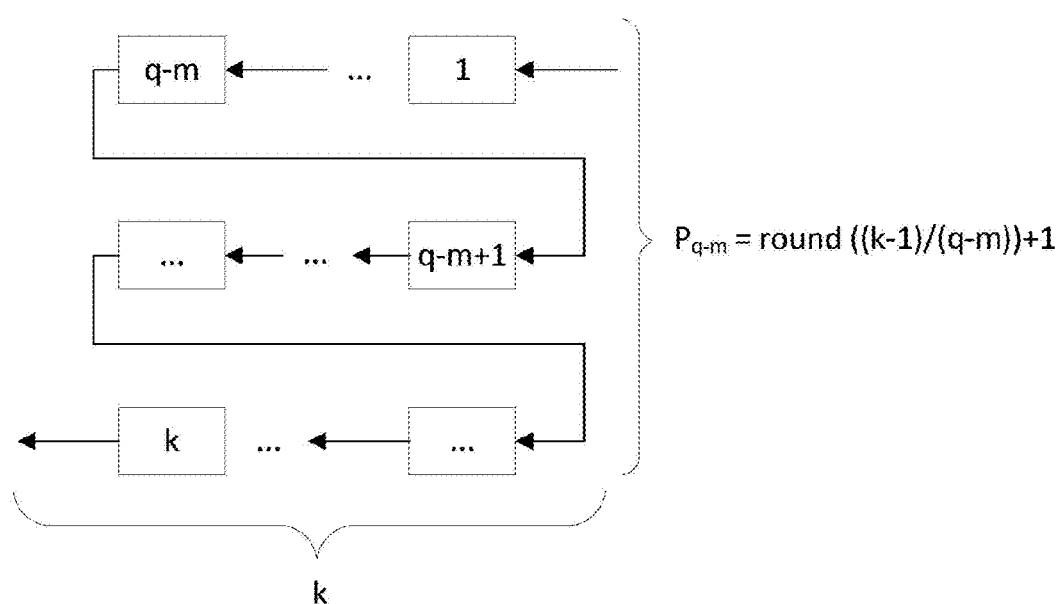

FIG. 2 illustrates a flowchart for distributing of "k" number of derivatives on nodes of a distributed storage system tree according to an exemplary aspect. According to an exemplary aspect, the distribution of derivatives is performed by derivative distribution module 220 as described above.

For purposes of this aspect, "q" is a predefined value that is the number of nodes at the level of l, $q_{min} \leq q \leq t_{min}$. In this aspect, the system is configured to determine a value of the minimum total of the derivatives required for the organization of storage of the file F with the chosen k, with the possibility of simultaneous failure of m and a rank of $r_{l,m} \geq k$. Without reduction of a commonality, the system has a sequence $\{pi\}$, where $i=1 \ldots q$, corresponding to the scales of nodes, that is $1 \leq p_i \leq p_i + 1 \; \forall_i$ ordered on no decrease. In this aspect, the system is designed to solve a problem of $\Sigma p_i \rightarrow \min$, where $i=1 \ldots q$, with satisfaction of the following condition: $\Sigma p_i \geq r_{l,m}$, where $i=1 \ldots q-m$.

It should be appreciated that on level l, the nodes will be considered as empty baskets that will be filled by individual (and unique) derivatives on 1-by-1 basis. In this exemplary aspect, the rank $r_{l,m}$ for the file F will be equal to k. As shown in FIG. 2, the following configuration for the first q–m nodes will be constructed. It should be appreciated that "q–m" is the available nodes for a given level since the m nodes are unavailable nodes as discussed above. According to this aspect, the system will fill k of derivatives on a cycle only for these nodes having reached the 1st element. The system then returns to q–m node and the process is repeated until k derivatives are distributed. This distribution algorithm provides no decrease of sequence of p from left to right, and gives $p_{q-m}$=round((k–1)/(q–m))+1, where the round function rounds any number to the next whole rejection of fractional part down. The system then adds the remained m of nodes with $p_{q-m}$ derivatives each. In other words, the total of derivatives will be, by construction, k+(round((k–1)/(q–m))+1)*m.

As discussed above, applying the definition of a rank according to an exemplary aspect, the remaining nodes after failure of m nodes have to contain not less than k derivatives, and if more than k derivatives are stored there, the last pq+m nodes in a chain will be, on construction, at least less than or equal to the any of the failed m nodes. Therefore, the weight of the dropped m nodes will not be able to be less than proposed. Moreover, if exactly k derivatives are stored in the first q–m nodes, the disclosed method exactly provides the most uniform distribution of nodes weights. It should be appreciated that the same estimation of minimum total weight w for particular number of nodes q will be true if we replace k by the rank:

$$w = r_{l,m} + (\text{round}((r_{l,m}-1)/(q-m))+1)*m$$

In general, the rank of the file F is the mechanism of an evaluation of reliability of its storage in the conditions of failures, including geographically distributed storage using the tree T, for example. According to an exemplary aspect, it is preferable that the minimum rank, under the terms of storage, is more than or equal to k to ensure recoverability in the event of a failure. Moreover, usually the rank can be bigger than k, and a surplus of derivatives for storage can be provided for the solution of problems of productivity increase, reduction of latency and optimization of storage.

According to another exemplary aspect, the system is configured to store into one node the k number of derivatives, making it possible to reconstruct the file locally without downloading derivatives from other servers, etc. Moreover, the remaining derivatives can be spread out on 1-by-1 basis to other nodes/servers to satisfy fault tolerance of the disclosed system and method. For a rank of $r_{l,m} \geq k$, the system should have the minimum quantity of derivative k+m–1+$r_{l,m}$, with q=$r_{l,m}$+m, i.e., overall minimal number of nodes with data related to the file to implement the scheme, where m–1+$r_{l,m}$ from them will contain only one derivative in each, and in the remaining node the system will store k derivatives. According to this scheme, the system guarantees performance of a condition of $r_{l,m} \geq k$ in case of m nodes failure. Redundancy of storage makes it possible to estimate as (k+m–1+$r_{l,m}$)/k=1+$r_{l,m}$m/k+(–1)/k, approximately 2 or greater. Typically, the rank $r_{l,m}$ is about k order, and m is small against k.

Figure 3A:
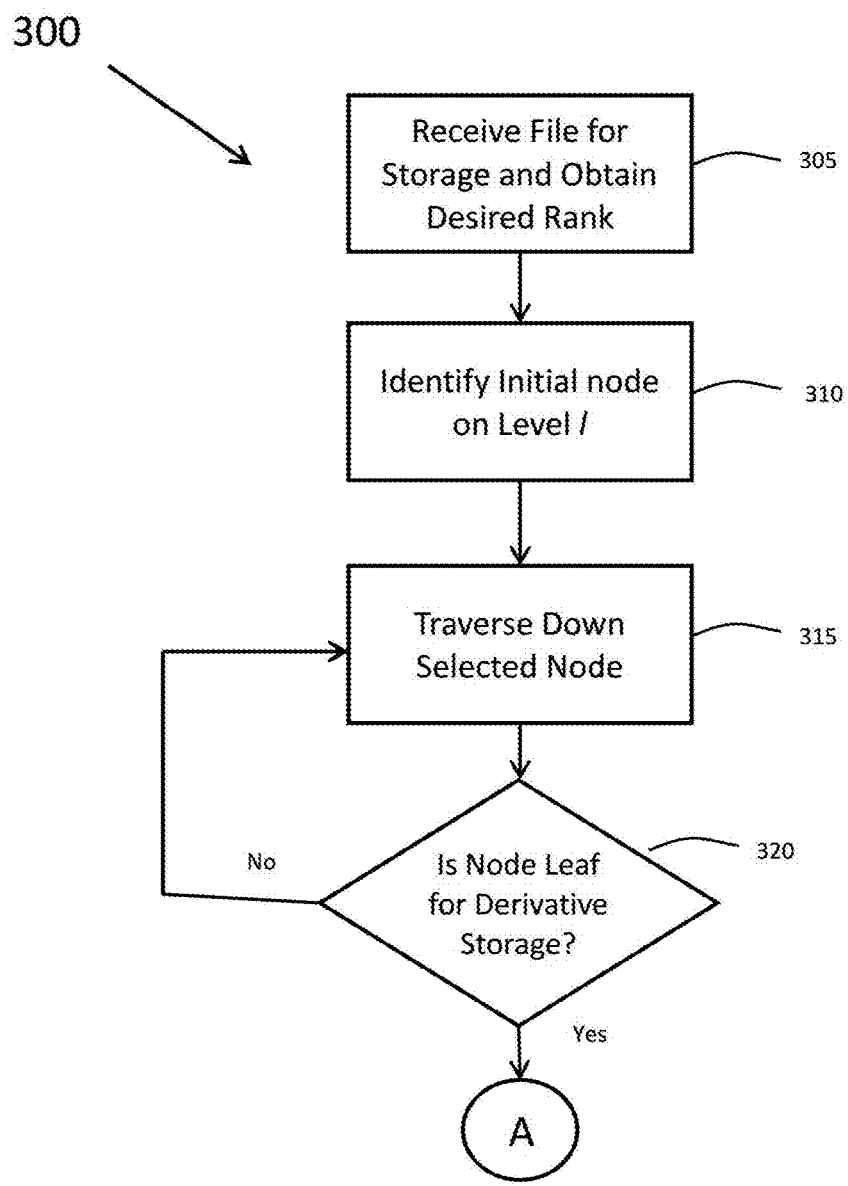
FIGS. 3A and 3B illustrate a flowchart for a method of distributing of derivatives of a file in a distributed storage system according to an exemplary aspect.
Figure 3B:
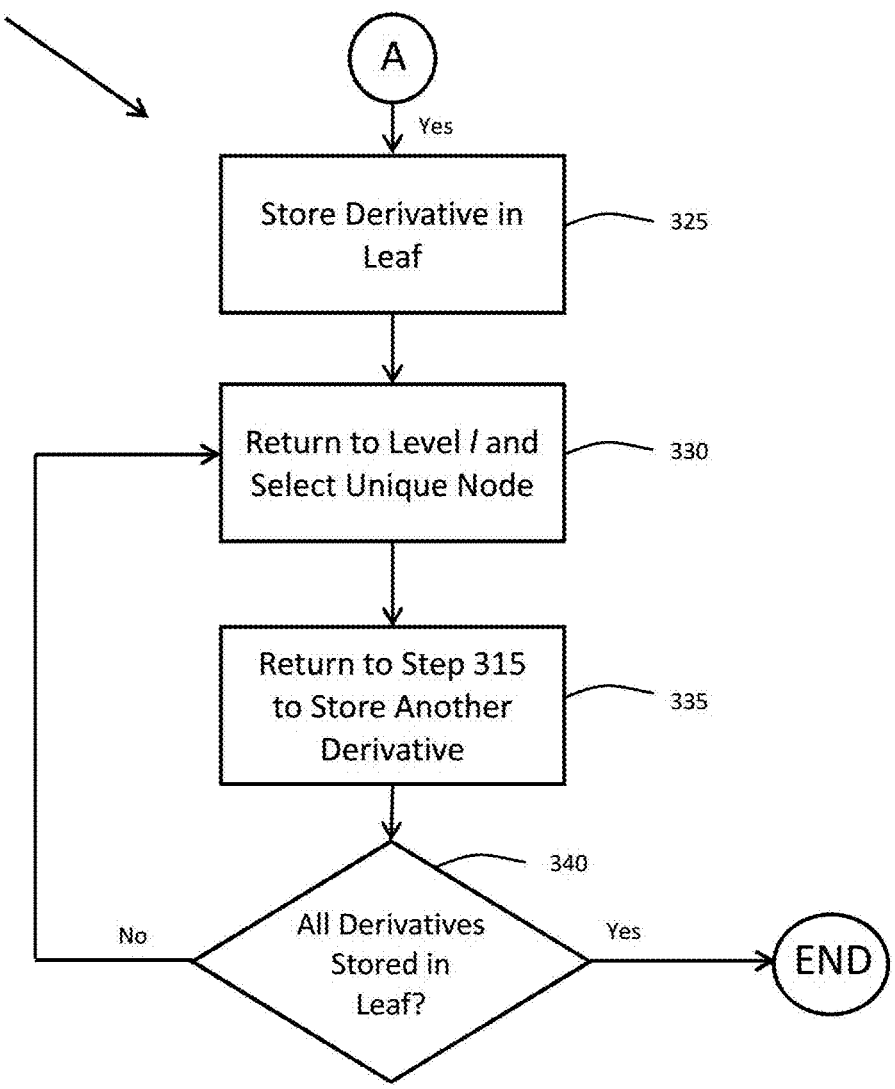

FIGS. 3A and 3B illustrate a flowchart for a method 300 distributing of derivatives of a file in a distributed storage system according to an exemplary aspect. According to this aspect, the system is configured to store a file F using (n,k) storage scheme with a set value k and variable n. Moreover, as described above, level 1 and nodes m are defined as indicators of the fault tolerance, i.e., if no more than m nodes of level 1 are unavailable, the system should be able to recover the file if there are k derivatives. In other words, the following relation should be fulfilled: $r_{l,m} \geq k$. According to the exemplary aspect, the system (e.g., computer 110) is configured to specify the initial position of the derivatives in the distributed storage system (e.g., tree $T_F$ shown in FIG. 1B), as well as to provide effective mechanisms for controlling and monitoring the specified system requirements.

In this exemplary aspect, the system preferably identifies a starting node N of the level $l_{beg}$ (for example, a rack or a computer can be used for the algorithm's starting point). In this instance, the algorithm (i.e., a "balancer") selects one item from the provided list of nodes, which can be done by random selection or selection based on any policies, such as the game theory, current load of node, or the like. In one aspect, the balancer has a list of nodes $\{gi\}$, $i=1 \ldots q$ as input, and as output provide the only valid value j, where $1 \leq j \leq q$. In an aspect, a value l, m and $r_{l,m}$ are a rank that is set to achieve a desired distribution for the data storage of file F.

In particular, referring to FIG. 3A, initially at step 305, the system (e.g., computer 110) is configured to receive and/or identify a file F for storage in the distributed storage system and obtain/determine a rank $r_{l,m}$ to be used to determine the distribution of the storage of the file. At step 310, computer 110 identifies an initial node on a level l of the storage tree $T_F$, which can be identified randomly, for example, as noted above. Next, the computer traverses or goes down along the tree until it reaches a bottom "leaf". In other words, if there are q nodes of the level $l_{beg-1}$ connected to the current node N at the level $l_{beg}$, the load balancer provides one of the nodes, and the process is repeated cyclically until it reaches the lowest level of storage, see steps 315 and 320. Once the computer 110 reaches the "leaf" in the distributed storage system, the computer 110 stores a first derivative in the identified leaf at step 325.

Next, at step 330, the computer 110 returns from the current level to the level l, and, at this level, the computer 110 selects another unique $r_{l,m}$+m–1 nodes and, at step 335, returns to step 315 to repeat the procedure of descending or traversing down to a node selected at each step of the descent to store another derivative on the next node (step 340).

According to the exemplary aspect, the computer 110 utilizes a balancer algorithm at each level and even at each element of the level that may have its scheduling algorithm. In one aspect, the step of selecting each node "locally" for descent with respect to the initial node N, for example, can be to select only those nodes that are located in the group of a level above the l+1, which contains the node N of the level l.

Applying the algorithm illustrated in FIGS. 3A and 3B, after the process of storing derivatives is complete, the system will have the weight of each of the $r_{l,m}$+m nodes at the level l equals to 1, which ensures that there will be sufficient k derivatives for reconstruction of file F in event of a node failure, as contemplated above.

According to an additional aspect, the system is configured to monitor the distribution of derivatives in the distributed data storage system (e.g., tree $T_F$ of FIG. 1B) to ensure the rank $r_{l,m}$ of file F is maintained. In one aspect, a simple, but inefficient, algorithm is continuously run as a verifier (e.g., a polling algorithm) that starts the search in the system of derivatives of the file and computes instantaneous rank on the basis of the current state. However, it should be appreciated that applying such a polling algorithm, complexity of such queries will be equal to the number of the files in the system, and will become unreasonably expensive as the system resource requirements increase.

Accordingly, the computer 110 is further configured to perform a monitoring at the level l and below this level with respect to each derivative. In this instance, after the initial distribution of derivatives (discuss above, for example), the computer 110 is configured to track that each other node/subtree has independently at least one derivative stored within. Thus, in the root of each subtree, it is preferable that information about the required storage of at least one derivative should be stored. If the distribution algorithm is that the derivative passes through this layer in the process of its placement, the computer 110 may store this information, tag the ID of the file at this level as "monitored" (for example, storing an integer counter p, i.e., the analog of weight), and later execute search only within the subtree down to each of the "leaf" to confirm the derivative. Thus, the computer 110 is configured to reduce the number and volume of search queries and to make them independent from each other.

According to another aspect, when additional derivatives are added into the same subtree, the computer 110 is further configured to determine the marked monitored subtrees of this file and increment p to this thread for a specific file. It should be appreciated that it is not required to watch for all derivatives, so data dissemination algorithms do not have to find all of them.

In addition, the computer 110 is further configured to track that each of the $r_{l,m}$+m nodes is "alive". Preferably, computer 110 can perform this tracking either at the level above (e.g., maintaining the list of nodes with the size $r_{l,m}$+m and periodically verifying their status), or using the algorithm of grouping nodes at the level l (i.e., if they have the possibility of mutual monitoring). This algorithm can serve as one of the processes to enable balance between on-demand and periodic search and work only "through events".

Moreover, a combined version of the monitoring algorithms can be implemented. In this instance, each node is configured to store only the counter of "monitored" derivatives for any files and takes some action on the search and perform a verification only in the case of certain events such as "node inaccessibility" of lower levels. Then after distributing the derivatives of the file F, the computer 110 can increment the counter. In this case, it is presumed that all conditions are satisfied as long as the accident is happened, such that it will then be necessary to start the procedure of reverification of all files accessing at the lower level. Alternatively, the verification can also be performed periodically.

In this instance, for such scheme it is necessary to store both a counter of controlled files and a list of IDs (in the case of restart of verification procedures). However, from the standpoint of maintenance costs, this scheme is much more efficient. Moreover, according to one aspect, the system performs a "parcel" treatment, for example, by sending all subnodes list IDs for verification and dividing it into a relatively small packets in order to minimize the impact on the system performance. It is also noted that the amount of data storage on the node in the list ID can be relatively high, i.e., there are a lot of files from all storage that requires attention at this level, which may be mentioned in the corresponding table.

For exemplary purposes, the number of monitored files is estimated based on the total number of files in the repository, the number q of nodes of the level l, the share v of all files that require the disclosed distributed data storage at the level l ($0 \le v \le 1$), and the average size k+m for all files in the repository on this level l. Based on the uniform distribution of files across nodes, the system provides an average number of files within one node (or rather, in its subtree) NF*v*(k+m)/q. If the level l is high, and a lot of files require the fault tolerance during the storage at this level, the estimated amount may be very large, for example. On the other hand, if the level is small (for example, the level of the computer or rack), then q can be significantly larger than k+m, which can reduce the overhead.

According to the foregoing aspect, the system and method disclosed herein considers the rank $r_{l,m}$ of a file F with a pre-defined k as a function of two variables l and m inside the tree $T_F$. In an additional aspect, the system (e.g., computer 110) is configured to construct a table of storage reliability ("File Reliability Matrix" or "FRM") for the file F with the size (l×m), in which in each cells, the system stores the value of the rank $r_{l,m}$ for a specific tree $T_F$ topology. Then, the area of the table (i.e., the set of cells) that contain a number greater or equal to k indicate the value of a safe storage of the file, meaning the file F can be recovered/reassembled in the event of a node failure condition.

FIG. 4 illustrates an exemplary table of a file reliability matrix for the storage tree $T_F$ illustrated in FIG. 1B and discussed above. The exemplary file reliability matrix is provided for 12 derivatives stored in the disks 156a through 156g as described above. It is reiterated that the number in each cell indicates the minimum number of available derivatives in the event of a node failure at that specific level for a given number of nodes. For example, the cell l=6 and m 1 indicates the number "2", which is the minimum number of available derivatives if one of the data centers 153a or 153b (i.e., which are considered to be on level 6) were to fail. For example, if data center 152a was to fail and all nodes under data center 152a were unavailable, then the only derivatives that would be available would be under data center 152b, which are the derivatives stored in disks 156f and 156g. In contrast, if data center 152b were to fail, then there would be 10 derivatives available in disks 156a through 156d. However, as noted above, each cell in the file reliability matrix illustrated in FIG. 4 provides the minimum number of available derivatives in the event of a possible node failure at a given level.

Applying the exemplary file reliability matrix, the exemplary aspect further determines that the k number of derivatives is equal to 3. It should be appreciated that k being equal to 3 is only provided as an example and that an alternative example could require more or less derivatives to recover a file F in the event of a failure. In any event, with k being equal to 3, and applying the exemplary file reliability matrix, the system is able to determine that the distributed storage system (include, for example, tree $T_F$ of FIG. 1B) must operate without any operations and events in the system extending outside the highlighted area of the file reliability matrix illustrated in FIG. 4. In other words, the highlighted area can be considered an area of "safe operations" that do not violate the reliability requirements of the disclosed system and method. The matrix illustrates monotonic decreasing of the values from the lower-left corner of the table in all directions.

In a variation of the exemplary aspect, the system consider a slightly different version of the same table for the choice of k for a pre-defined n. In this instance, it is assumed that the rank value in each cell corresponds to a hypothetical k and the n (e.g., n=12), that is, each derivative of each cell will have a different size equal to S/k. For example, the cell (3, 2) with a value of 4 (as illustrated in the file reliability matrix illustrated in FIG. 4) will match the implementation of the algorithm D for k=4, with the size of each derivative equal to ¼ of the size of the original file. Thus, the table describes the maximum value of k, in which the current location will restore the file. In other words, the system does not have storage redundancy more than minimum, which it is necessary in the disclosed topology.

Consequently, the system and method is further configured to create a table of redundancy storage (i.e., "File Storage Redundancy Matrix" or "FSRM") for the selected value of k and for the selected location of derivatives on nodes where each cell already contains the ratio of the total amount of information stored in the system, which is always the size of 12 derivatives S/k (according to the disclosed example), to the size of the file (which will always equal S).

FIG. 5 illustrates an exemplary table of a file storage redundancy matrix according to an exemplary aspect. Based on the exemplary tables, the system (e.g., computer 110) is further configured to evaluate the impact of adding an additional derivative of the file F in order to maximize the reliability of the file storage in the system. Preferably, the computer 110 is configured to store the additional derivative in a node of the tree $T_F$ with minimum weight of each level, and in it, in its turn, into the sub node with minimum weight, which is up to equal weights of the nodes if there are several nodes with the same weight, a node with a minimum weight member should be chosen.

According to the exemplary aspect, the system is configured to add the new derivative (i.e., the 13th element) to a disk of any computer connected to Rack1 (i.e., rack 154d) in the DC2 152b. The additional derivative results in the exemplary file reliability matrix shown in FIG. 6. It should be appreciated that note that none of the "$0^{th}$" cells have changed because the system has added new nodes only to the storages (e.g., disk 156f or 156g) where at least one derivative is already stored and no new leaves are added to the tree $T_F$.

According to yet a further exemplary aspect, the system disclosed herein is configured to determine the importance of each node in a tree structure of a distributed storage system in terms of reliable data storage for a file F. FIGS. 7A-7D illustrate exemplary file reliability matrices when each of the racks 154a-154d of the tree $T_F$ in FIG. 1B fails. For each of these four nodes, the system is configured to remove its availability (and the corresponding derivatives) from the system and recalculate the rank $r_{l,m}$ of the file to determine how it changes. This change indicates the importance of the node to the system.

In particular, the importance of each node includes determining the number of non-zero cells in the table for the file F, since each of the "non-zero" cells is responsible for the fact that there is at least one derivative of the file F that is available in the case of the system failure. This total number is indicative of what other failure(s) that the system can endure, i.e., it is a measure of how problematic the failure of the selected node will. In addition, the sum of all non-zero cells also provides a similar measurement as indicates the number of nodes in the system after all possible failures. Thus, higher weight values are located in the lower levels with lower number of failures, i.e., these values will dominate in such sum.

Preferably, both the number of non-zero cells and the sum of all non-zero cells can serve as a tool for comparison of the node and the group of one level. According to one aspect, the system is configured to normalize the numbers at each node after calculating such values so that the sum is equal to 1. Then, the relative values may be compared numerically— for example, the 0.2 said that, in the case of failure of that node "on the average" twice more nodes remain, than in the case of failure of the node with a value of 0.1—in the respective tables of reliability.

FIG. 7A illustrates an exemplary file reliability matrix when rack 154b (i.e., node Rack2 with a weight of "4" as shown in the tree $T_F$ in FIG. 1B) fails. In the original FRM table discussed above (before any node failure), there were 17 non-zero cells, the sum of all cells was equal to 59, and the average weight for one non-zero cell was equal to 3.47 (i.e., 59 divided by 17). The FRM table illustrated in FIG. 7A considers when rack 154b fails. In this instance, the computer is configured to determine that there are 12 non-zero cells, the sum of all cells is equal to 27, and the average weight for one cell is equal to 2.25 (i.e., 27 divided by 12).

Similarly, the FRM table illustrated in FIG. 7B considers when rack 154a fails. In this instance, the computer is configured to determine that there are 13 non-zero cells, the sum of all cells is equal to 30, and the average weight for one cell is equal to 2.31 (i.e., 30 divided by 13). Moreover, the FRM table illustrated in FIG. 7C considers when rack 154c fails. In this instance, the computer is configured to determine that there are 13 non-zero cells, the sum of all cells is equal to 43, and the average weight for one cell is equal to 3.31 (i.e., 43 divided by 13). Finally, the FRM table illustrated in FIG. 7D considers when rack 154d fails. In this instance, the computer is configured to determine that there are 10 non-zero cells, the sum of all cells is equal to 29, and the average weight for one cell is equal to 2.90 (i.e., 29 divided by 10).

Thus, in view of the FRM tables illustrated in FIGS. 7A-7D, the system 110 is configured to determine a Rack level sequence {2.31, 2.25, 3.31, 2.9}, or in the normalized form, {0.21,0.21,0.31,0.27}. According to the exemplary aspect, the system is configured to determine that the large values are responsible for more reliable data storage, since in the case of the failure of the corresponding element there are more data in the system to build the file, i.e., its reliability is higher. In other words, the number with the higher value is less significant for the overall reliability of file F since the failure of the corresponding element (i.e., the corresponding rack) will result in fewer losses.

It should be appreciated that, based on the numbers reflective of these exemplary FRM tables, the failure of a single rack Rack1 with weight equal to 1 (i.e., rack 154c) in the second room of the first data center (i.e., DCH2 153b) is just one and a half times "better" than the failure, for example, of one of the first data center rack Rack1 with a weight of 5 (i.e., rack 154a) despite the fact that the number of unavailable derivatives is 5 times higher when rack 154a fails. This is because the number of non-zero cells in the reliability tables after a failure in each case is the same, i.e., it is 13.

According to the exemplary aspect, the proposed method makes it is possible to streamline the importance of all nodes in terms of fault-tolerant storage of the specific file F by calculating their quantitative characteristics. Having these values for each file stored in the node, the system can easily estimate the overall importance of the server for the system as a whole, for example, summing the normalized indexes for each file F. It should be noted that, depending on the number stored in the separate file server, these characteristics can be significantly different, and be a good base for predictive algorithms that control the fault tolerance of the data storage system.

Figure 8A:
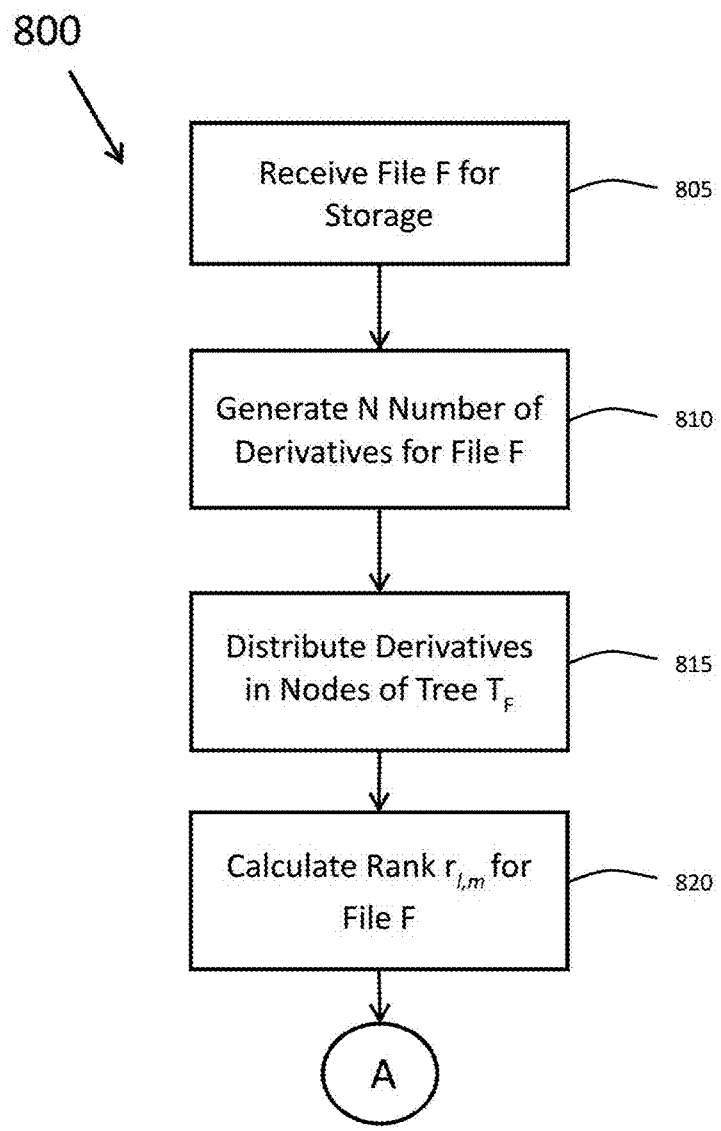
FIGS. 8A and 8B illustrate a flowchart for a method of reliable distributed storage according to an exemplary aspect.
Figure 8B:
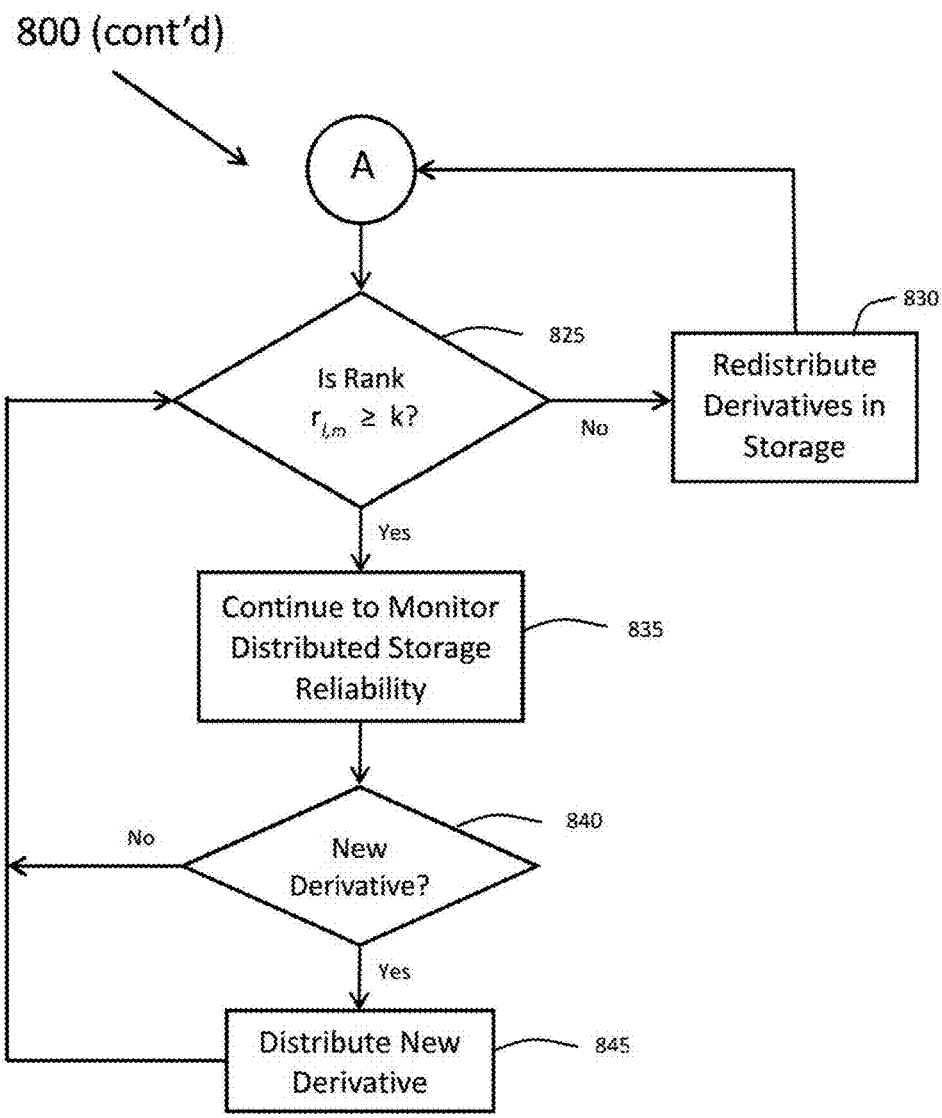

FIGS. 8A and 8B illustrate a flowchart for a method of reliable distributed storage according to an exemplary aspect. As described above, the computer 110 illustrated in FIG. 1A is configured to store one or more files F in a distributed storage system, such as across servers 120-140. Each of the disks 122A-122C, 132A-132C and 142A-142C in the distributed storage system can be configured to store one or more derivatives of the file F that is generated according to the (n,k) scheme as known to those skilled in the art. Preferably, the distributed storage system is configured according to a multi-level tree structure, such as the tree structure illustrated in FIG. 1B, for example. The method illustrated in FIGS. 8A and 8B make reference to the components illustrated in FIGS. 1A and 1B, as described above, but should in no way be limited to the specific embodiments.

As shown, initially at step 805, computer 110 receives a file for distributed data storage. It is noted that while the description herein refers generally to computer 110, the exemplary method can be performed by the applicable modules as described above with respect to FIG. 1C. As shown at step 810, computer 110 is further configured to generate a number of N derivatives of file F according to the (n,k) scheme as known to those skilled in the art. Then, at step 815, the computer 110 is configured to transmit each derivative to a node in the tree $T_F$ for storage, where one node or leaf (e.g., each disk 156a-156g) can store one or more derivatives of file F. According to one aspect, the derivatives are distributed to nodes according to the algorithm described above with respect to FIGS. 3A and 3B, although the exemplary method is not so limited.

In any event, once the derivatives are stored in the nodes of the distributed storage system, the computer 110 is configured to calculate a rank $r_{l,m}$ of the file F according to the algorithms described above. For example, the computer 110 is configured to calculate a file reliability matrix, as shown in FIG. 4, for example. It is noted that while the exemplary method shown in FIG. 8A calculates the rank $r_{l,m}$ of the file F after the derivatives are distributed to the various nodes, in an alternative embodiment, the rank $r_{l,m}$ of the file F is predefined or precalculated and the distribution of derivatives is performed to satisfy the rank. In other words, a value k according to the (n,k) scheme will be selected (e.g., k=3) and then the derivatives N will be distributed in the distributed storage system to obtain a rank $r_{l,m}$ of the file F that complies with a predefined file reliability matrix (e.g., the table shown in FIG. 4, for example). Thus, according to this aspect, the performance of steps 815 and 820 would be reversed.

Next, at step 825 (shown in FIG. 8B), the computer is further configured to determine if the rank $r_{l,m}$ of the file F is greater than or equal to the k value of the (n,k) scheme. If k is greater than the rank $r_{l,m}$ of the file F, the method proceeds to step 830 where one or more of the derivatives is redistributed or redistributed to one or more different nodes in the distributed storage system in an attempt to adjust to the rank $r_{l,m}$ of the file F. Upon such redistribution, the method returns to step 825 to again compare the value k against the rank $r_{l,m}$ of the file F. If the rank $r_{l,m}$ of the file F is greater than or equal to the value k, the computer 110 proceeds to step 835 where it continues to monitor the reliability of storage of file F, as explained above. Optionally, at step 840, the method further determines whether any additional derivatives should be added to the data distribution network. If no, the method can return to step 825 to again compare the value k against the rank $r_{l,m}$ of the file F. Alternatively, if another derivative of file F is to be added to a node in tree $T_F$, the method proceeds to step 845 where the computer 110 effectuates distribution and storage of such derivative. As described above, for example with respect to FIG. 6, the distribution of an additional derivative is performed to maximize the reliability and recoverability of file F based on the current rank $r_{l,m}$ of the file F.

In a variation of the exemplary aspect, step 830 of the exemplary method can be performed in order to achieve a maximum load balancing and/or reliability and/or accessibility of the data in the distributed data storage system. Moreover, it should be appreciated that the rank $r_{l,m}$ of the current file F can be used to distribute additional files to follow the same distribution pattern and achieve the same reliability (i.e., the same $r_{l,m}$) according to another aspect.

As described in detail above, the system and method disclosed herein is provided to calculate a rank $r_{l,m}$ of the fault tolerance of a file F stored in a distributed data storage system. In particular, the file F is stored within the (n,k) scheme in a multilevel tree $T_F$ with a fixed distribution of N derivatives over the leaves of the tree, such that the rank is equal to the sum $p_{l,m}$ of the number p of derivatives over all the nodes of the level l, except m with the biggest values of p among them. In essence, the system considers all of the nodes of level l with their appropriate p-value, sort them in ascending order, and remove the last m from this order. Then, the system summarizes the remaining p-values and gets the rank $r_{l,m}$ indicating the vault tolerance of the file F.

The inventors have provided a proof of the theorem for the fault tolerance calculated according to the exemplary aspect. In this proof, the total number of derivatives remaining is determined after the failure of a node. It is not more than m nodes of the level l, each of which contains its own value p as shown in the tree of FIG. 1B.

If the nodes that are dropped according to this theorem 1 were failed, the theorem is proved. If it is defined that the other nodes were failed at the same level, but with a smaller (or equal) p value, it means that the total weight $p_i$ of the remaining nodes is at least no less than $p_{l,m}$. This indicates that the number of derivatives available after the failure cannot be reduced, and, effectively, the rank $r_{l,m}$ cannot be decreased.

A first subsidiary theorem or "lemma" is considered. For the file F stored within the (n,k) model in the tree TF with the fixed distribution of a number N of derivatives over the leaves of the tree as described above, the following statement is true: when l1>l2 (i.e., the level one is higher than level two) and m1≥m2, the ranks are related to each other as follows: $r_{l1,m2} \geq r_{l1,m1}$.

In fact, even for the global distribution, it is true that the descent down over the hierarchy of the storage with the same number of potentially failed nodes will not worsen the rank of the file. In other words, if instead of the failure of two racks in one data center, we assume the failure of two computers anywhere in the world, and the rank of the file will not get worse.

Moreover, it is considered that one step "downhill" in the tree $T_F$ hierarchy in the case of the number of failures equal to m2, which has not increased in comparison with m1, (when it goes down more than one step, we can easily do the generalization of the proof by induction). The theorem test whether the rank could be reduced (i.e., could the number of available derivatives decrease?). Under this theorem, the rank could not be reduced because below the tree node the number of derivatives that has become unavailable, cannot be increased (i.e., in the worst case it would be the same, in the best case it changes to the smaller side, because the other branches of the tree will come out of the failure).

Moreover, the theorem considers the same values for m, i.e., m1=m2. Based on the theorem described above, in order to calculate the rank, the system first sorts in non-decreasing order p nodes of the one level, and drop m1 nodes with maximum p. Then, in the same way, the system sorts nodes at "lower level" based on their weights, regardless of the place where the node is "connected" to the tree at the level above. To satisfy the theorem, it is necessary to prove that the sum of the weights of the last m1 nodes of level l1 in this list is greater or equal to the sum of the weight of the last m1 nodes of level l2. To do so, the theorem consider the structure of the two ordered lists. It should be noted that the length of the "bottom" list is greater or equal to the length of the "upper" list because there will always be at least one node in the list "facing" the respective upper member of the upper list with the non-zero weight (otherwise, we will get a top-level node which is not connected to anything).

Figure 9A:
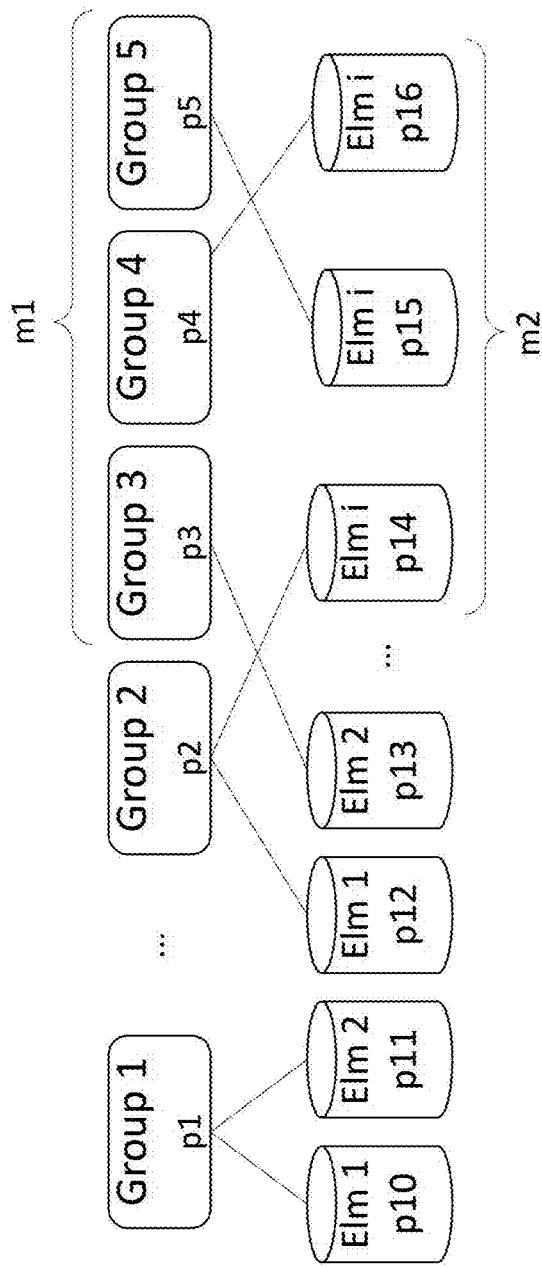
FIGS. 9A-9D illustrates exemplary flowcharts and formulas for subsidiary theorems of the exemplary aspects.

FIG. 9A illustrates two lists of nodes for dropping after sorting according to a first subsidiary theorem of the exemplary aspect. As shown, the recent correspondence between m1 nodes from both lists is considered (assumed that m1=m2). In this scenario, there are three possible cases.

The first case is that all dropped nodes from the lower list belong to the dropped nodes from the upper list (for example, m1=2 and the last two nodes are discarded from the both lists). Then, it is easy to show that as each node weight of the lower group is less than or equal to the total group weight, the total amount of the dropped nodes on the level below cannot be enlarged. For example, as shown in FIG. 9A2, if Group5 contains an element with a weight of p15 and potentially something else, and Group4 element with a weight of p16 and potentially something else, then the sum of the weights p4+p5>p15+p16.

The second case is for an opposite situation when none of the m1 nodes of the bottom level of the list are included into the dropped m1 group of upper level. According to the construction of the lists, the weight of any group of m1 is no less than the weight of any of other left nodes (to which the discarded nodes should belong to). As a result, in the very least the weight of the dropped m1 nodes of level 2 (i.e., they are not greater than the number of the nodes) cannot be greater than the weight of the dropped m1 nodes on level 1.

The third case is when a part of the dropped m1 nodes of level 2 is included into dropped nodes and a part of them are not included (for example, minimum one dropped node exists where all sub nodes of which did not include into m1 dropped nodes on level 2). In the example (as shown in FIG. 9A, for example), the node with the weight p14 is not included into the node of level 1 with the weight p3, but it was included into the node with the weight p2, which is not dropped. However, according to the composition it follows that p14≤p2≤p3 because p14 is included into p2 and p3 stands higher in the sorted nodes list. So, according to the first case when p15+p16≤p4+p5, the resulting sum of p14+p15+p16≤p3+p4+p5 is provided. As a result, the theorem that the rank is non-decreasing is true.

Finally, if m1>m2, then the theorem considers a two-step procedure. First, based on proof above, it is known that we can state $r_{l2,m2} \geq r_{l1,m2}$. Moreover, $r_{l1,m2} \geq r_{l1,m2}$ because m1>m2 and more nodes (m1−m2>0) need to be drop which may contain nodes with non-zero weight (this happens if there are enough nodes on level l1 with non-zero weight). So, transitively, the conclusion that $r_{l2,m2} \geq r_{l1,m2} \geq r_{l1,m1}$ indicates that the first subsidiary theorem is true even for m1>m2.

It is further noted that the requirement m1≥m2 is important. For example, if all nodes contain one node of the weight equal to 1 and if 4 nodes are dropped (for instance) on the bottom level and 3 nodes (m1=3 and m2=4) on the higher level, it will mean that only 3 nodes are discarded with a total weight equal to 3, which is less than 4 and the subsidiary theorem is incorrect.

A second subsidiary theorem (i.e., "lemma 2") is considered in which, for any level l with the rank $r_{l,m1} > 0$ and m1<m2 the following ratio is correct: $r_{l,m2} < r_{l,m1}$. In this theorem, it is considered that with the increasing number of possible failures on the one level in the fixed configuration of distribution of the derivatives, the rank always decreases.

Figure 9B:
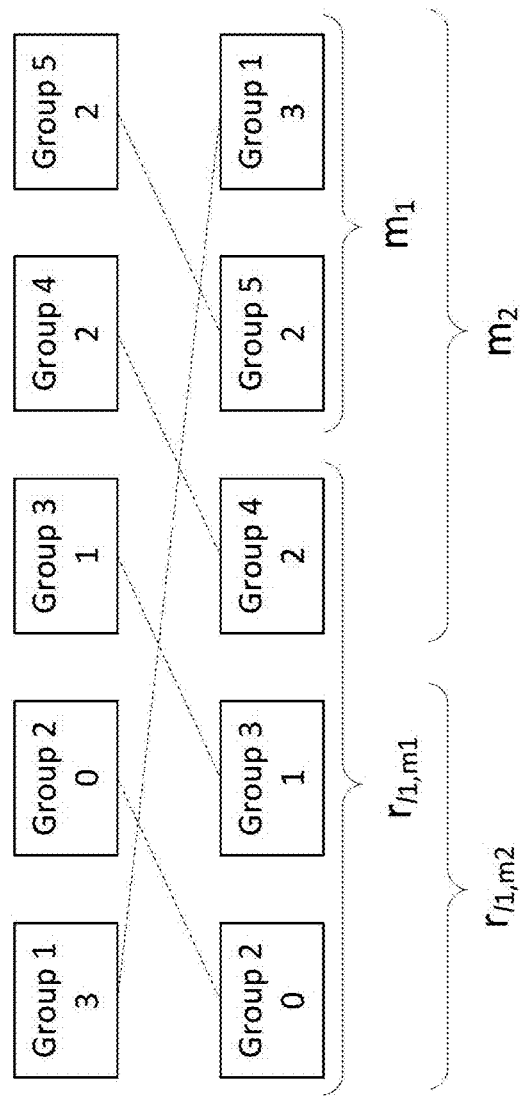

The proof of this subsidiary theorem stems from the demand of non-emptiness of the nodes dropped in addition to m1. It contains at least one node with non-zero weight, and, therefore, the general summarized weight of the left nodes in the list has to decrease, for example, as illustrated in FIG. 9B. It is noted that because $r_{l,m1} > 0$, then there is at least one additional node with non-zero weight. But for Lemma 1 (discussed above) proof with m1>m2, it cannot be guaranteed that there is at least one group with non-zero weight in the difference, and the equation that rl1,m2≥rl1,m1 needs to be used instead of strict in equation of $r_{l,m2} < r_{l,m1}$.

It is also necessary to note that if it is considered that m of simultaneous failure at different levels, it is easy to show that the rank of $r_{l1,m}$ (where l1 is the maximum level appearing in failed nodes) can serve as upper bound for reliability rank $r_{l1,m}$. So, the theorem will consider a node with the highest l1 level and will add to this level all nodes below which in a subtree there is at least one failed node (quantity no more than m−1). Then, in compliance with the first subsidiary theorem, the rank of $r_{l,m}$ will be greater than or equal to than rank for the construction: $r_{l,m} \geq r_{l1,m}$.

In fact, all failed nodes can simply be "lifted" onto a single maximum level among them (potentially joining some of them) and the received configuration can be used for reliability assessment, i.e., as though nodes at single level failed. In case of adding new nodes into storage, the rank of any given file obviously does not change if it is not supplemented with new derivatives. Referring to FIG. 9B, it is also easy to show that in case of adding new nodes with additional derivatives into the storage the rank of any given file can only increase. The same statement true about the addition of new derivatives in the available nodes of storage.

In addition, as further described above, the system and method is configured to distribute the derivatives of the file F to satisfy a predefined rank, for example. According to a third subsidiary theorem, it will be assumed that if k and a rank of reliability for the file $r_{l,m}$ is set, the system will determined the number of nodes at various levels of storage required and how many file derivatives should be created and how they should be distributed in the storage system described herein.

Figure 9C:
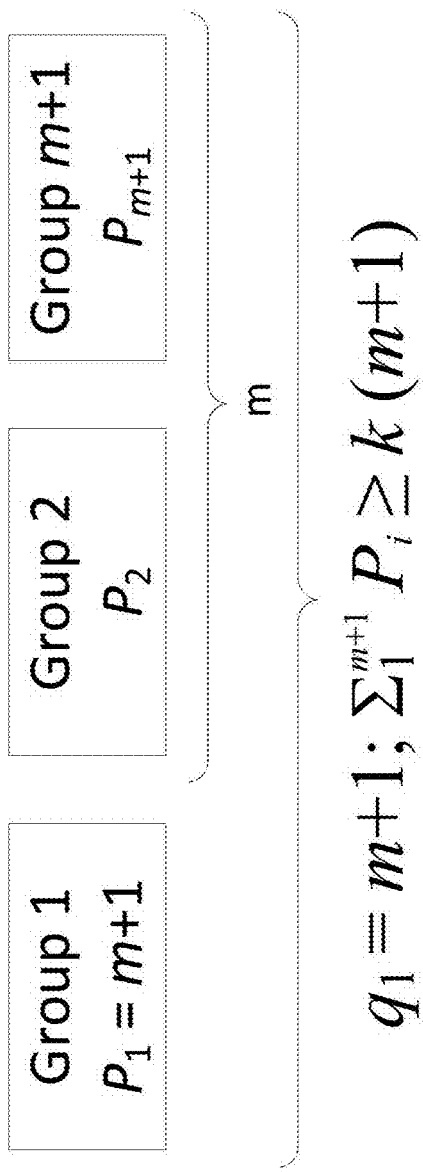

According to the third subsidiary theorem (i.e., "Lemma 3", if the amount of the nodes on chosen level l is equal to q, then for each file stored in the system with rank $r_{l,m} \geq k$, the following relation should be satisfied: q≥m+1, and a minimum number of the nodes on the level l should satisfy $q_{min}$=m+1. Referring to FIG. 9C, the proof of this theorem, comes from the definition of the fault tolerance rank, and all m of the derivatives that belong to nodes remained after failure can be placed in the very last not failed node which should exists as shown in FIG. 9C, for example. It is also easy to estimate the minimum value of the number of derivatives given for such configuration.

Moreover, according to a fourth subsidiary theorem (i.e., "Lemma 4"), for any file stored in system with a rank of $r_{l,m} \geq k$, and minimal quantity of nodes $q_{min}=m+1$ at the chosen level l, the minimum total weight has to be $r_{l,m}*q_{min}$.

In particular, if inside the only not failed remaining element there are at least $r_{l,m}$ number of derivatives (for meeting the demand of the initial file recoverability), then, by definition, in system it is at least $r_{l,m}*(m+1)$ derivatives—as in each of the remained nodes rejected by m cannot be less than in the last of them. Moreover, as $r_{l,m} \geq k$, the chosen scheme of storage, it turns out that it is not necessary to create not less than $k*(m+1)$ derivatives, as shown in FIG. 9C, which, for example, illustrates the minimum number of nodes at a given level. In fact, the total amount of the stored data is equal to the same case of full replication of the file in number of copies no less than m+1 (i.e., the value of the general redundancy parameter of the file storage). That is, the choice of splitting data with use of erasure codes in such configuration does not give a win in space in comparison with simple replication of the initial file.

However, it is noted that it is not the only scheme of distribution of derivatives on nodes. In extreme case, the system stores only one derivative in each element of level l. Therefore, this is a scheme with maximal possible number of nodes with at least one derivative in it, but with minimal number of derivatives to satisfy rank requirements.

Finally, according to a fifth subsidiary theorem (i.e., "Lemma 5"), for any file stored in system with a rank of $r_{l,m} \geq k$, the minimal total weight will be $t_{min}=r_{l,m}+m$, and the quantity of nodes q at the chosen level l should satisfy the following condition: $q \geq r_{l,m}+m$.

Figure 9D:
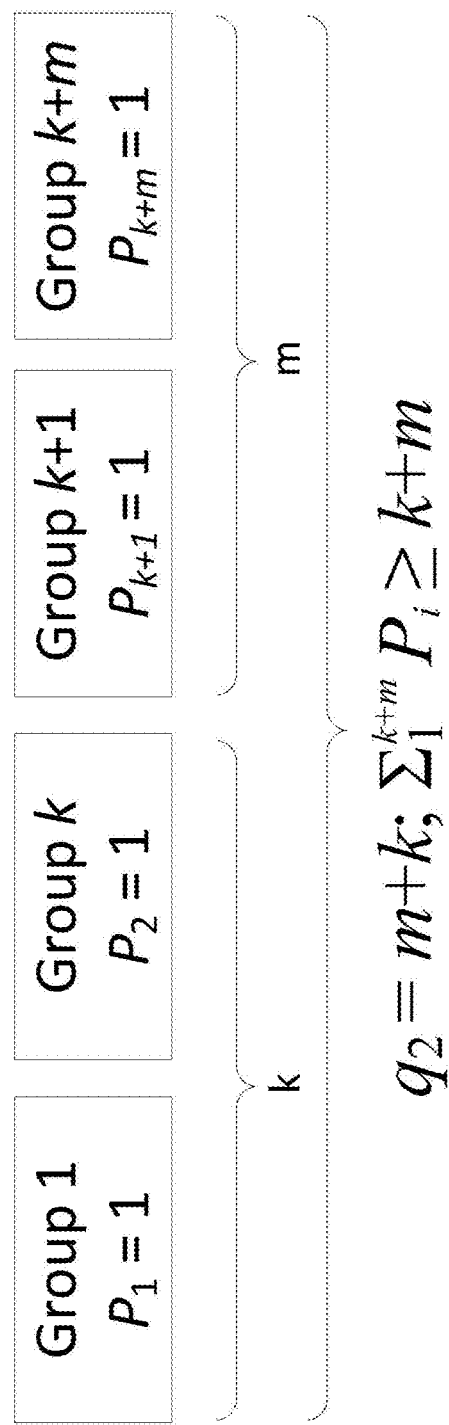

It this case, the set of nodes are constructed such that some of them have to contain only one derivative while some nodes may contain no derivatives. Similar to theorem 1, the nodes are sorted in the same order. If there is a failure of m nodes, then, obviously, m nodes will be dropped with m derivatives overall, and, by rank definition, there should be at least $r_{l,m}$ more nodes (which should contain no more than one derivative in each, by list construction, for example, as shown in FIG. 9D, which illustrates minimum redundancy case). Then, obviously, the total weight cannot be less than $t_{min}=r_{l,m}+m$, and overall number of nodes on the level l, by construction, again cannot be less than $t_{min}=r_{l,m}+mm$. It is noted that $t_{min} \geq k+m$ by definition.

As shown in FIG. 9D, the redundancy for file storage (ratio of stored size over file size) will be the minimal possible, equal to $r_{l,m}/k+m/k \geq 1+m/k$ (as compared to 1+m in Lemma 4). Proceeding from these maximum and minimum options, it is possible to pick up concrete cases optimum (with the minimum redundancy) distribution of derivatives for level nodes.

Figure 10:
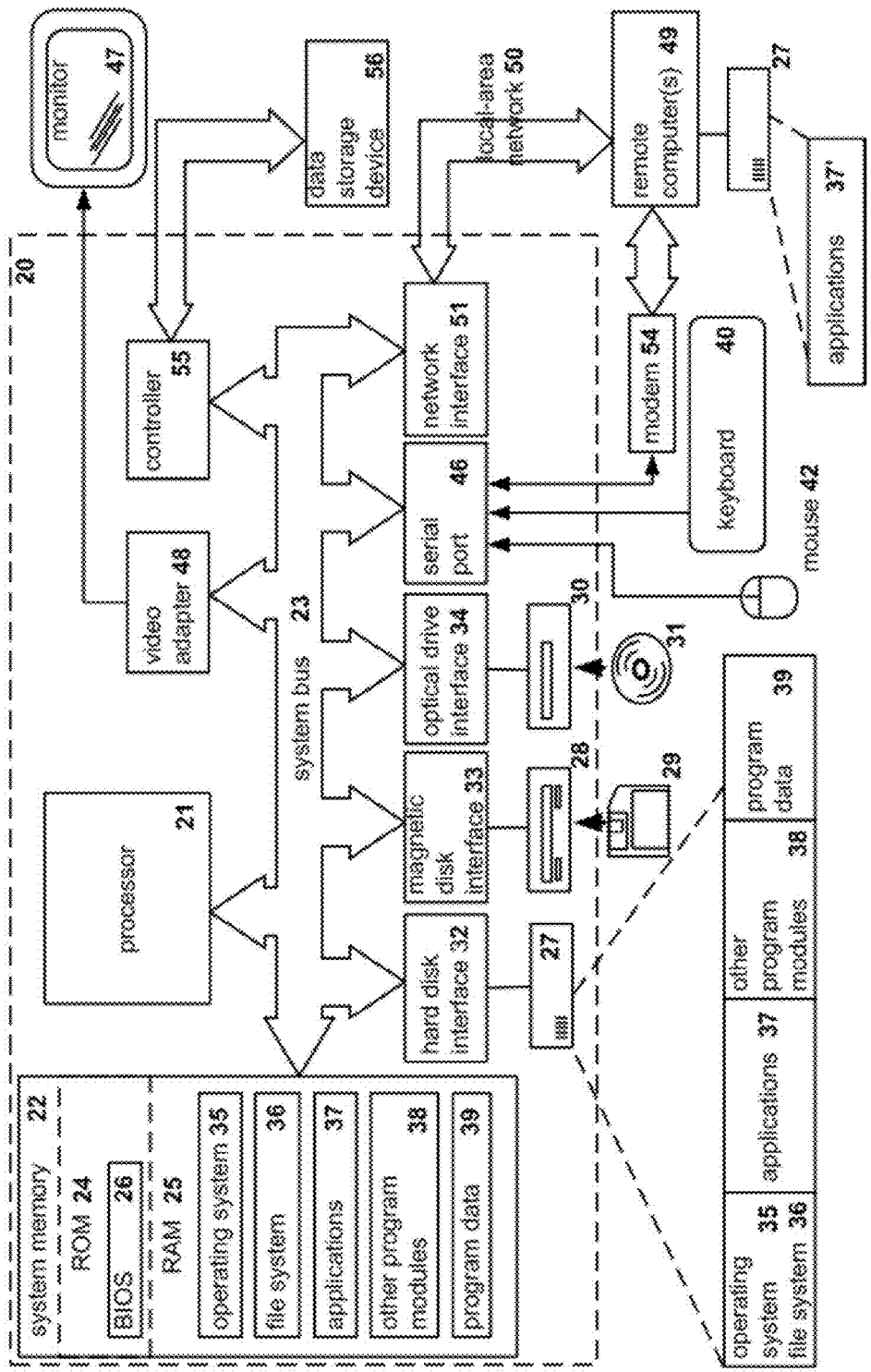
FIG. 10 illustrates an example of a general-purpose computer system on which the disclosed systems and method can be implemented.

Finally, FIG. 10 illustrates an example of a general-purpose computer system (which may be a personal computer or a server) on which the disclosed systems and method can be implemented according to an example aspect. It should be appreciated that the detailed general-purpose computer system can correspond to the computer 110 described above with respect to FIG. 1. Moreover, the remote computer(s) 49, as described below, can correspond to the nodes (e.g., servers 120, 130, and 140) and/or the nodes of the multi-level tree shown in FIG. 1B, as discussed above with respect to the exemplary system and method.

As shown in FIG. 10, the computer system 20 includes a central processing unit 21, a system memory 22 and a system bus 23 connecting the various system components, including the memory associated with the central processing unit 21. The central processing unit 21 can correspond to the CPU 114 and the system memory 22 can correspond to memory 116 of FIG. 1, according to an exemplary aspect. Furthermore, the system bus 23 is realized like any bus structure known from the prior art, including in turn a bus memory or bus memory controller, a peripheral bus and a local bus, which is able to interact with any other bus architecture. The system memory includes read only memory (ROM) 24 and random-access memory (RAM) 25. The basic input/output system (BIOS) 26 includes the basic procedures ensuring the transfer of information between elements of the personal computer 20, such as those at the time of loading the operating system with the use of the ROM 24.

The personal computer 20, in turn, includes a hard disk 27 for reading and writing of data, a magnetic disk drive 28 for reading and writing on removable magnetic disks 29 and an optical drive 30 for reading and writing on removable optical disks 31, such as CD-ROM, DVD-ROM and other optical information media. The hard disk 27, the magnetic disk drive 28, and the optical drive 30 are connected to the system bus 23 across the hard disk interface 32, the magnetic disk interface 33 and the optical drive interface 34, respectively. The drives and the corresponding computer information media are power-independent modules for storage of computer instructions, data structures, program modules and other data of the personal computer 20.

The present disclosure provides the implementation of a system that uses a hard disk 27, a removable magnetic disk 29 and a removable optical disk 31, but it should be understood that it is possible to employ other types of computer information media 56 which are able to store data in a form readable by a computer (solid state drives, flash memory cards, digital disks, random-access memory (RAM) and so on), which are connected to the system bus 23 via the controller 55.

The computer 20 has a file system 36, where the recorded operating system 35 is kept, and also additional program applications 37, other program modules 38 and program data 39. The user is able to enter commands and information into the personal computer 20 by using input devices (keyboard 40, mouse 42). Other input devices (not shown) can be used: microphone, joystick, game controller, scanner, and so on. Such input devices usually plug into the computer system 20 through a serial port 46, which in turn is connected to the system bus, but they can be connected in other ways, for example, with the aid of a parallel port, a game port or a universal serial bus (USB). A monitor 47 or other type of display device is also connected to the system bus 23 across an interface, such as a video adapter 48. In addition to the monitor 47, the personal computer can be equipped with other peripheral output devices (not shown), such as loudspeakers, a printer, and so on.

The personal computer 20 is able to operate within a network environment, using a network connection to one or more remote computers 49. The remote computer (or computers) 49 are also personal computers or servers having the majority or all of the aforementioned elements in describing the nature of a personal computer 20. Other devices can also be present in the computer network, such as routers, network stations, peer devices or other network nodes.

Network connections can form a local-area computer network (LAN) 50, such as a wired and/or wireless network, and a wide-area computer network (WAN). Such networks are used in corporate computer networks and internal company networks, and they generally have access to the Internet. In LAN or WAN networks, the personal computer 20 is connected to the local-area network 50 across a network adapter or network interface 51. When networks are used, the personal computer 20 can employ a modem 54 or other modules for providing communications with a wide-area computer network such as the Internet. The modem 54, which is an internal or external device, is connected to the system bus 23 by a serial port 46. It should be noted that the network connections are only examples and need not depict the exact configuration of the network, i.e., in reality there are other ways of establishing a connection of one computer to another by technical communication modules, such as Bluetooth.

In various aspects, the systems and methods described herein may be implemented in hardware, software, firmware, or any combination thereof. If implemented in software, the methods may be stored as one or more instructions or code on a non-transitory computer-readable medium. Computer-readable medium includes data storage. By way of example, and not limitation, such computer-readable medium can comprise RAM, ROM, EEPROM, CD-ROM, Flash memory or other types of electric, magnetic, or optical storage medium, or any other medium that can be used to carry or store desired program code in the form of instructions or data structures and that can be accessed by a processor of a general purpose computer.

In the interest of clarity, not all of the routine features of the aspects are disclosed herein. It will be appreciated that in the development of any actual implementation of the present disclosure, numerous implementation-specific decisions must be made in order to achieve the developer's specific goals, and that these specific goals will vary for different implementations and different developers. It will be appreciated that such a development effort might be complex and time-consuming, but would nevertheless be a routine undertaking of engineering for those of ordinary skill in the art having the benefit of this disclosure.

Furthermore, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

The various aspects disclosed herein encompass present and future known equivalents to the known modules referred to herein by way of illustration. Moreover, while aspects and applications have been shown and described, it would be apparent to those skilled in the art having the benefit of this disclosure that many more modifications than mentioned above are possible without departing from the inventive concepts disclosed herein.

What is claimed is:

1. A method for data storage in a distributed data storage system, the method comprising:
generating a plurality of derivatives from a file using an (n,k) algorithm, wherein the (n,k) algorithm provides that a minimum number k of the derivatives is required to restore the file;
storing the derivatives in a plurality of nodes in a multi-level tree, wherein the multilevel tree includes at least L levels and the plurality of nodes are geographically distributed data storage modules;
determining a rank $r_{l,m}$ indicating a fault tolerance of the file, wherein the rank $r_{l,m}$ represents a number of derivatives available after a failure on at least one level l of the L levels with a number of failed nodes m in the level l;
determining whether the rank $r_{l,m}$ is greater than or equal to the minimum number k;
responsive to determining that the rank $r_{l,m}$ is less than the minimum number k, storing at least one of the plurality of derivatives in a different node of the plurality of nodes or storing at least one additional derivative from the file in one of the plurality of nodes.

2. The method of claim 1, further comprising verifying an acceptable fault tolerance of the file if the rank $r_{l,m} \geq k$.

3. The method of claim 1, further comprising reassembling the file from the distributed storage system using the (n,k) algorithm.

4. The method of claim 1, wherein at least one of $k \geq 3$ and $m \geq 2$.

5. The method of claim 1, further comprising:
generating a plurality of derivatives from at least one additional file using the (n,k) algorithm;
storing the derivatives from the at least one additional file in the multilevel tree, such that the rank $r_{l,m}$ of the at least one additional file is greater than or equal to k,
wherein if a number of nodes on one level l of the L levels of the multilevel tree is equal to q, then for the at least one additional file, a relation of $q \geq m+1$ is satisfied, and a minimum number of the nodes on the one level l satisfies $q_{min} = m+1$.

6. The method of claim 1, further comprising storing the derivatives in the plurality of nodes in the multilevel tree, such that none of the derivatives are duplicates.

7. The method of claim 1, further comprising determining the rank $r_{l,m}$ indicating the fault tolerance of the file, such that the rank $r_{l,m}$ is equal to a sum $p_{l,m}$ of the number p of derivatives over all the elements of the level l, except for m with a biggest values of p.

8. The method of claim 1, wherein the storing of the derivatives in the plurality of nodes comprises:
storing a number of k derivatives on q–m nodes for one level l of the levels L, where q–m is a number of available nodes on the level l; and
storing remaining derivatives on the q–m nodes for the one level l,
wherein a total number of derivatives will be k+(round ((k–1)/(q–m)) +1) * m.

9. The method of claim 1, wherein the determining of the rank $r_{l,m}$ indicating of the file comprises calculating table of a file reliability matrix having a plurality of cells that each indicate a rank for each level l of the levels L and a corresponding number of node failures m of the level l.

10. A system for data storage, the system comprising:
a distributed data storage system including a plurality of nodes arranged in a multilevel tree having at least L levels, wherein the plurality of nodes are geographically distributed data storage modules; and
a processor configured to:
generate a plurality of derivatives from a file using an (n,k) algorithm, wherein the (n,k) algorithm provides that a minimum number k of the derivatives is required to restore the file, store the derivatives in the plurality of nodes in the plurality of nodes, determine a rank $r_{l,m}$ indicating a fault tolerance of the file, wherein the rank $r_{l,m}$ represents a number of derivatives available after a failure on at least one level l of the L levels with a number of failed nodes m in the level l, determine whether the rank $r_{l,m}$ is greater than or equal to the minimum number k, responsive to determining that the rank $r_{l,m}$ is less than the minimum number k, store at least one of the plurality of derivatives in a different node of the plurality of nodes or store at least one additional derivative from the file in one of the plurality of nodes.

11. The system of claim 10, wherein the processor is further configured to verify an acceptable fault tolerance of the file if the rank $r_{l,m} \geq k$.

12. The system of claim 10, wherein the processor is further configured to reassemble the file from the distributed storage system using the (n,k) algorithm.

13. The system of claim 10, wherein at least one of $k \geq 3$ and $m \geq 2$.

14. The system of claim 10, wherein the processor is further configured to:

store a number of k derivatives on q−m nodes for one level l of the levels L, where q−m is a number of available nodes on the level l; and store remaining derivatives on the q−m nodes for the one level l, wherein a total number of derivatives will be k+(round ((k−1)/(q−m)) +1) * m.

15. The system of claim 10, wherein the processor is further configured to evaluate the rank $r_{l,m}$ indicating of the file by calculating table of a file reliability matrix having a plurality of cells that each indicate a rank for each level l of the levels L and a corresponding number of node failures m of the level l, such that the file reliability matrix indicates a fault tolerance state of the file in the distributed data storage system.

16. The system of claim 10, wherein if a top level of the multilevel tree of the distributed data storage system fails, then all nodes on lower levels of the multilevel tree become unavailable.

17. A non-transitory computer readable medium storing computer executable instructions for storing data in a distributed data storage system, including instructions for:

generating a plurality of derivatives from a file using an (n,k) algorithm, wherein the (n,k) algorithm provides that a minimum number k of the derivatives is required to restore the file;

storing the derivatives in a plurality of nodes in a multi-level tree, wherein the multilevel tree includes at least L levels and the plurality of nodes are geographically distributed data storage modules;

determining a rank $r_{l,m}$ indicating a fault tolerance of the file, wherein the rank $r_{l,m}$ represents a number of derivatives available after a failure on at least one level l of the L levels with a number of failed nodes m in the level l;

determining whether the rank $r_{l,m}$ is greater than or equal to the minimum number k;

responsive to determining that the rank $r_{l,m}$ is less than the minimum number k, storing at least one of the plurality of derivatives in a different node of the plurality of nodes or storing at least one additional derivative from the file in one of the plurality of nodes.

18. The non-transitory computer readable medium according to claim 17, further including instructions for:

generating a plurality of derivatives from at least one additional file using the (n,k) algorithm;

storing the derivatives from the at least one additional file in the multilevel tree, such that the rank $r_{l,m}$ of the at least one additional file is greater than or equal to k, wherein if a number of nodes on one level l of the L levels of the multilevel tree is equal to q, then for the at least one additional file, a relation of q≥m+1 is satisfied, and a minimum number of the nodes on the one level l satisfies $q_{min}$=m+1.

19. The non-transitory computer readable medium according to claim 17, further including instructions for determining the rank $R_{l,m}$ indicating the fault tolerance of the file, such that the rank $r_{l,m}$ is equal to a sum $p_{l,m}$ of the number p of derivatives over all the elements of the level l, except form with a biggest values of p.

* * * * *